United States Patent [19]
Nobukata

[11] Patent Number: 6,058,042
[45] Date of Patent: May 2, 2000

[54] SEMICONDUCTOR NONVOLATILE MEMORY DEVICE AND METHOD OF DATA PROGRAMMING THE SAME

[75] Inventor: Hiromi Nobukata, Kanagawa, Japan

[73] Assignee: Sony Corporation, Tokyo, Japan

[21] Appl. No.: 09/219,836

[22] Filed: Dec. 23, 1998

[30] Foreign Application Priority Data

| Dec. 26, 1997 | [JP] | Japan | 9-361467 |
| Dec. 26, 1997 | [JP] | Japan | 9-361469 |
| May 28, 1998 | [JP] | Japan | 10-147709 |
| May 28, 1998 | [JP] | Japan | 10-147710 |

[51] Int. Cl.$^7$ .................................................. G11C 16/04
[52] U.S. Cl. .............................. 365/185.03; 365/185.18; 365/185.12; 365/185.25; 365/185.22
[58] Field of Search ......................... 365/185.03, 185.18, 365/185.25, 185.12, 185.22, 185.17

[56] References Cited

U.S. PATENT DOCUMENTS

| 5,835,414 | 11/1998 | Hung et al. | 365/185.25 |
| 5,870,335 | 2/1999 | Khan et al. | 365/185.03 X |

OTHER PUBLICATIONS

1995 IEEE International Solid–State Circuits Conference; Digest of Technical Papers; A Multilevel–Cell 32Mb Flash Memory; M. Bauer et al. (pp. 132, 133 and 135).

1996 IEEE International Solid–State Circuits Conference; Digest of Technical Papers; A 3.3V 128Mb Multi–level NAND Flash Memory for Mass Storage Applications; Tae–Sung Jung et al. (pp. 32 and 33).

*Primary Examiner*—Huan Hoang
*Attorney, Agent, or Firm*—Ronald P. Kananen; Rader, Fishman & Grauer

[57] ABSTRACT

A nonvolatile semiconductor memory device having a memory cell in which an amount of charge stored in a charge storage unit changes according to a voltage supplied to a word line and a bit line, a threshold voltage changes according to that change, and data of a value according to the threshold voltage is stored, and writing trinary or more multi-bit data into memory cells in units of pages, provided with a precharging means for precharging all bit lines to a predetermined voltage before the write operation and a write control circuit having a latch circuit by which the write data is latched, making the bit line selected in accordance with an address discharge in accordance with the latch data, and performing write operations in parallel.

15 Claims, 17 Drawing Sheets

| INPUT/OUTPUT DATA | LATCH DATA (WRITE) | LATCH DATA (READ) |
|---|---|---|
| {D2, D1} = {0, 0} | {Q22, Q21} = {H, L} | {Q22, Q21} = {H, H} |
| {D2, D1} = {0, 1} | {Q22, Q21} = {L, L} | {Q22, Q21} = {H, L} |
| {D2, D1} = {1, 0} | {Q22, Q21} = {L, H} | {Q22, Q21} = {L, H} |
| {D2, D1} = {1, 1} | {Q22, Q21} = {H, H} | {Q22, Q21} = {L, L} |

Vth DISTRIBUTION

SEMICONDUCTOR NONVOLATILE MEMORY DEVICE AND METHOD OF DATA PROGRAMMING THE SAME

BACKGROUND OF THE INVENTION

1. Field of the Invention

The present invention relates to a multi-level type nonvolatile semiconductor memory device for recording trinary or more data in a memory cell and to a method of data programming the same.

2. Description of the Related Art

A nonvolatile semiconductor memory device such as a flash memory normally has a binary type memory cell structure for recording data taking two values of "0" and "1" in one memory transistor.

Along with the recent demands for increasing the capacity of semiconductor memory devices, a so-called multi-level type nonvolatile semiconductor memory device for recording trinary or more data in one memory cell transistor has been proposed (refer to for example "A Multi-Level 32 Mb Flash Memory" '95 ISSCC P132 on).

FIG. 1 is a view of the relationship between a threshold voltage Vth level and data content where a data consisting of 2 bits and taking four values is recorded in one memory transistor in a NAND type flash memory.

In FIG. 1, an ordinate represents the threshold voltage Vth of the memory transistor, and an abscissa represents a frequency of distribution of the memory transistor.

Further, the content of the 2-bit data comprising the data recorded in one memory transistor is represented by $[IO_{n+1}, IO_n]$. Four states of $[IO_{n+1}, IO_n]=[1, 1], [1, 0], [0, 1],$ and $[0, 0]$ exist. Namely, four states of data "0", data "1", data "2", and data "3" exist.

A NAND type flash memory for writing multi-level data in units of pages (units of word lines) has been proposed (refer to for example the document: 1996 *IEEE International Solid-State Circuits Conference, ISSCC96/SESSION 2/FLASH MEMORY/PAPER TP 2.1:A 3.3 V 128 Mb Multi-Level NAND Flash Memory for Mass Storage Application*, pp 32–33).

FIG. 2 is a circuit diagram of the structure of principal parts of a NAND type flash memory for performing a write operation in units of pages disclosed in the above document.

In FIG. 2, 1 denotes a memory cell array, 2 a write/read control circuit, and BL1 and BL2 denote bit lines.

The memory cell array 1 is constituted by memory strings A0 and A1 having memory cells which are connected to common word lines WL0 to WL15. The memory string A0 is connected to the bit line BL1, and the memory string A1 is connected to the bit line BL2.

The memory string A0 has a NAND string in which memory cell transistors MT0A to MT15A comprising part of a nonvolatile semiconductor memory device having a floating gate are connected in series, a drain of the memory cell transistor MT0A of this NAND string is connected to the bit line BL1 via a selection gate SG1A, and a source of the memory cell transistor MT15A is connected to a reference voltage line VGL via a selection gate SG2A.

The memory string A1 has a NAND string in which memory cell transistors MT0B to MT15B comprising a part of a nonvolatile semiconductor memory device having a floating gate are connected in series, the drain of the memory cell transistor MT0B of this NAND string is connected to the bit line BL2 via a selection gate SG1B, and the source of the memory cell transistor MT15B is connected to a reference voltage line VGL via a selection gate SG2B.

The gates of the selection gates SG1A and SG1B are commonly connected to a selection signal supply line SSL, and the gates of the selection gates SG2A and SG2B are commonly connected to a selection signal supply line GSL.

A write/read control circuit 2 is constituted by n-channel MOS (NMOS) transistors NT1 to NT19, a p-channel MOS (PMOS) transistor PT1, and latch circuits Q1 and Q2 formed by connecting an input and an output of the inverter.

The NMOS transistor NT1 is connected between a supply line of a power supply voltage $V_{cc}$ and the bit line BL1, and the gate is connected to the supply line of an inhibit signal IHB1. The NMOS transistor NT2 is connected between the supply line of the power supply voltage $V_{cc}$ and the bit line BL2, and the gate is connected to the supply line of an inhibit signal IHB2.

A depletion type NMOS transistor NT18 is connected between a connection point of the NMOS transistor NT3 and the NMOS transistor NT1 and the connection point of the memory string A0 and the bit line BL1, and a depletion type NMOS transistor NT19 is connected between the connection point of the NMOS transistor NT4 and the NMOS transistor NT2 and the connection point of the memory string A1 and the bit line BL2. The gates of the NMOS transistors NT18 and NT19 are connected to a decouple signal supply line DCPL.

The NMOS transistors NT3, NT5, and NT16 are connected in series between the connection point of the depletion type NMOS transistor NT18 and the NMOS transistor NT1 and a bus line IOi, and the NMOS transistors NT4, NT7 and NT17 are connected in series between the connection point of the depletion type NMOS transistor NT19 and the NMOS transistor NT2 and a bus line IOi+1.

Further, the connection point of the NMOS transistors NT3 and NT5 and the connection point of the NMOS transistors NT4 and NT7 are grounded via the NMOS transistor NT6 and, connected to the drain of the PMOS transistor PT1 and the gates of the NMOS transistors NT8 and NT13. The gate of the NMOS transistor NT6 is connected to the supply line of a reset signal RST, the source of the PMOS transistor PT1 is connected to the supply line of the power supply voltage $V_{cc}$, and the gate of the PMOS transistor PT1 is connected to the supply line of the signal Vref.

A first storage node N1a of the latch circuit Q1 is connected to the connection point of the NMOS transistors NT5 and NT16, and a second storage node N1b is grounded via NMOS transistors NT8 to NT10 connected in series.

A first storage node N2a of the latch circuit Q2 is connected to the connection point of the NMOS transistors NT7 and NT17, and a second storage node N2b is grounded via NMOS transistors NT13 to NT15 connected in series.

Further, the connection point of the NMOS transistors NT8 and NT9 is grounded via NMOS transistors NT11 and NT12 connected in series.

The gate of the NMOS transistor NT9 is connected to the first storage node N2a of the latch circuit Q2, the gate of the NMOS transistor NT10 is connected to the supply line of a signal ØLAT2, the gate of the NMOS transistor NT11 is connected to the second storage node N2b, the gate of the NMOS transistor NT12 is connected to the supply line of a signal ØLAT1, and gates of the NMOS transistors NT14 and NT15 are connected to the supply line of a signal ØLAT3.

The gate of the NMOS transistor NT16 serving as a column gate is connected to the supply line of a signal Yi, and the gate of the NMOS transistor NT17 serving as a column gate is connected to the supply line of a signal Yi+1.

Further, FIG. 3A is a timing chart at the time of reading; and FIG. 3B is a timing chart at the time of a write operation (programming).

As seen from FIG. 3B, the write operation of 4 values is carried out in three steps. The operation routine shifts to a next step at a stage where it is decided that all cells for which a write operation originally was to be performed in units of pages in each step are sufficiently written.

An explanation will be made of the read operation next.

First, the reset signal RST and signals PGM1 and PGM2 are set to the high level. By this, the first storage nodes N1a and N2a of the latch circuits Q1 and Q2 are pulled to the ground level. As a result, the latch circuits Q1 and Q2 are cleared.

Next, the read operation is carried out by setting the word line voltage to 2.4 V. Due to a fact that the cell current does not flow if the threshold voltage Vth is higher than the word line voltage (2.4 V), the bit line voltage holds the precharge voltage and its high level is sensed. On the other hand, due to the fact that the cell current flows if the threshold voltage Vth is lower than the word line voltage (2.4 V), the bit line voltage falls and its low level is sensed.

Next, the read operation is carried out at the word line voltage of 1.2 V. Finally the read operation is carried out at the word line voltage of 0 V.

More specifically, when the cell data is "00", the current does not flow in any of the word lines, therefore (1, 1) is output to the buses IOi+1 and IOi. First, when reading the data by setting the word line voltage at 2.4 V, the control signal ØLAT1 is set to a high level. At this time, the bit line is held at the high level since the cell current does not flow, so the NMOS transistor NT8 is held in the conductive state, and the second storage node N2b of the latch circuit Q2 is held at the high level since the latch circuit Q2 is cleared, so the NMOS transistor NT11 is held in the conductive state. Accordingly, the NMOS transistors NT8, NT11, and NT12 are held in the conductive state, the second storage node N1b of the latch circuit Q1 is pulled to the ground level, and the first storage node N1a of the latch circuit Q1 shifts to the high level. Next, when reading the data by setting the word line to 1.2 V, the control signal ØLAT3 is set to the high level. At this time, the bit line is held at the high level since the cell current does not flow, so the NMOS transistor NT13 is held in the conductive state, the second storage node N2b of the latch circuit Q2 is pulled to the ground level, and the first storage node N2a of the latch circuit Q2 shifts to the high level. Finally, when reading the data by setting the word line to 0 V, the control signal ØLAT1 is set to a high level. At this time, the bit line is held at the high level since the cell current does not flow, so the NMOS transistor NT8 is held in the conductive state, but the NMOS transistor NT11 becomes a non-conductive state since the second storage node N2b of the latch circuit Q2 is at the low level, and the first storage node N1a of the latch circuit Q1 holds the high level.

When the cell data is "01", the current flows only in the case of the word line voltage VWL00, and (0, 1) is output to the buses IOi+1 and IOi. First, when reading the data by setting the word line voltage to 2.4 V, the control signal ØLAT1 is set to a high level. At this time, the bit line becomes the low level since the cell current flows, so the NMOS transistor NT8 is held in the non-conductive state and the first storage node N1a of the latch circuit Q1 holds the low level. Next, when reading the data by setting the word line to 1.2 V, the control signal ØLAT3 is set to the high level. At this time, the bit line is held at the high level since the cell current does not flow, so the NMOS transistor NT13 is held in the conductive state, the second storage node N2b of the latch circuit Q2 is pulled to the ground level, and the first storage node N2a of the latch circuit Q2 shifts to the high level. Finally, when reading the data by setting the word line at 0 V, the control signal ØLAT1 is set to the high level. At this time, the bit line is held at the high level since the cell current does not flow, so the NMOS transistor NT8 is held in the conductive state, but the NMOS transistor NT11 becomes a non-conductive state since the second storage node N2b of the latch circuit Q2 is at the low level, and the first storage node N1a of the latch circuit Q1 holds the low level.

In cases where the cell data are "10" and "11" as well, similarly (0, 1) and (0, 0) are read out to the buses IOi+1 and IOi.

Next, an explanation will be made of the write operation.

In the circuit of FIG. 2, first, the write operation is carried out by the data stored in the latch circuit Q1, next, the write operation is carried out by the data of the latch circuit Q2, and finally the write operation is carried out by the data of the latch circuit Q1 again.

Here, when the write data is (Q2, Q1)=(1, 0), if the latch circuit Q1 is sufficiently written, the data is inverted from "0" to "1", but when (Q2, Q1)=(0, 0), the latch circuit Q1 does not (cannot) invert the data from "0" to "1" even if sufficiently written in the first step since it is necessary to use this data also as the write data of a third step.

The end of the write operation in each step is judged in a stage where the latch data on the noted side (Q2 or Q1) becomes all "1".

In the cell where the write data (Q2, Q1)=(0, 0), there is no inversion by the latch circuit Q1 at the first step, so there is no judgement of an end by a wired OR.

In the circuit mentioned above, as shown in FIG. 4, first, after performing the write operation of the cell with the write data "10" and "00" (Step 1) in accordance with the data of the latch circuit Q1, the write operation of the cell with the write data "01" and "00" (Step2) is carried out in accordance with the data of the latch circuit Q2, and finally the write operation of the cell with the write data "00" (Step 3) is carried out.

Namely, in the circuit of the related art explained above, the write operation with the write data "10" and "01" is carried out in only Step 1 and Step 2, therefore the time for writing "10" and "01" corresponds to the write time of Step 1 and Step 2 as it is. The write operation of the cell with the write data "00" is carried out in all of Step 1 to Step 3, but the write operation of Step 3 is carried out after lowering the ISPP voltage in preparation for excess writing between Step 2 and Step 3.

From this, it may be deduced that the write time of a cell with the write data "00" is almost the same as the write time of Step 3. From this, the write operation is serially carried out. This becomes a cause of an increase of the write time for 4 values.

As seen from FIG. 4, the sum of write times for the data "10" and "01" is almost the same as the write time for the data "00".

Further, the write operation is carried out by using a self boost, but the write inhibit voltage charged in the bit line drops by the threshold voltage Vth by the NMOS transistor to which the signals PGM1 and PGM2 are supplied and has become Vcc-Vth(B) (Vth(B): Vth influenced by a back bias effect).

In order to make the self boost possible in this state, it is necessary to set the Vth of the selection gate of the drain side of the memory cell high. This becomes an obstacle in realizing an increase of speed of the read operation.

Further, bit lines are charged before writing by a latch. When viewed from the latch, however, a bit line is a huge capacitor having a voltage of 0 V, so there is a possibility of inversion of the latch data at the instant of contact with a bit line when the latch data is "1".

In order to avoid this, when charging a bit line in accordance with the write data, the charging is carried out while setting the gate voltage of the NMOS transistors NT5 and NT7 low. For this reason, the charge current becomes small, and a long time has been taken for the charging of the bit line.

Further, a long time is taken for a verify read operation.

SUMMARY OF THE INVENTION

The present invention was made in consideration with such a circumstance and has as an object thereof to provide a nonvolatile semiconductor memory device capable of shortening the write and verify read time and a method of data programming the same.

According to a first aspect of the present invention, there is provided a nonvolatile semiconductor memory device having a memory cell in which an amount of charge stored in a charge storage unit changes according to a voltage supplied to a word line and a bit line, a threshold voltage changes according to that change, and data of a value according to the threshold voltage is stored, and writing trinary or more multi-bit data into memory cells in units of pages, provided with a precharging means for precharging all bit lines to a predetermined voltage before the write operation and a write control circuit having a latch circuit by which the write data is latched, making the bit line selected in accordance with an address discharge in accordance with the latch data, and performing write operations in parallel.

According to a second aspect of the present invention, there is provided a nonvolatile semiconductor memory device wherein a plurality of memory cells in each of which an amount of charge stored in a charge storage unit changes according to a voltage supplied to a word line and a bit line, a threshold voltage changes according to that change, and data of a value according to the threshold voltage is stored are connected, memory strings having one end and the other end connected to the bit line and a ground line via selection transistors controlled in conductive state in accordance with a gate voltage are arranged in the form of a matrix, control gates of memory cells of the same row are connected to a common word line, and trinary or higher multi-bit data is written into the memory cells in units of pages by using self boost, provided with a precharging means for precharging all bit lines to a predetermined voltage before the write operation and a write control circuit having a latch circuit by which the write data is latched, making a bit line selected in accordance with an address discharge in accordance with the latch data, and performing the write operations in parallel.

Preferably, the write control circuit is provided with one bit's worth of a latch circuit corresponding to every bit line.

Further, preferably, the latch circuit has a first storage node for holding a latch data level and a second storage node for holding an inverted level thereof and has a switching means for connecting the selected bit line and a reference voltage when the level of the second storage node of the latch circuit is a predetermined level.

Further, preferably further comprising of a verify read circuit for judging whether or not every write bit is sufficiently written at the time of a write operation by sequentially raising the word line voltage from a low level to high level.

According to a third aspect of the present invention, there is provided a method of data programming of a nonvolatile semiconductor memory device having a memory cell in which an amount of charge stored in a charge storage unit changes according to a voltage supplied to a word line and a bit line, a threshold voltage changes according to that change, and data of a value according to the threshold voltage is stored and writing trinary or more multi-bit data into memory cells in units of pages, comprising the steps of precharging all bit lines to a predetermined voltage before the write operation; making a bit line selected in accordance with an address discharge in accordance with latch data; and performing write operations in parallel.

Preferably, after all bit lines are precharged to a predetermined voltage, for example, the power supply voltage before a write operation, the bit line selected in accordance with the address is discharged in accordance with the latch data at the time of a write operation and thus the write operations are carried out in parallel.

According to a fourth aspect of the present invention, there is provided a nonvolatile semiconductor memory device having a memory cell in which an amount of charge stored in the charge storage unit changes via a tunnel insulation film according to a voltage supplied to a word line and a bit line, a threshold voltage changes according to that change, and data of a value according to the threshold voltage is stored and writing multi-bit data into memory cells in units of pages, having a means for performing the write operations by setting an electric field applied to the memory cell higher than the other write data in a case where the write data is the data for making the threshold voltage of the memory cell to be written in a value furthest from the threshold voltage in an initial erasing state.

Preferably, further comprising of a verify read circuit for judging whether or not every write bit is sufficiently written at the time of a write operation.

According to a fifth aspect of the present invention, there is provided a nonvolatile semiconductor memory device having a memory cell in which an amount of charge stored in a charge storage unit changes according to a voltage supplied to a word line and a bit line, a threshold voltage changes according to that change, and data of a value according to the threshold voltage is stored and writing the multi-bit data into memory cells in units of pages, provided with a write control circuit having a latch circuit and performing the write operations by charging the corresponding bit line to a first voltage when the latch data is data for making the threshold voltage of the memory cell a value furthest from the threshold voltage in the initial erasing state and by charging this to a second voltage higher than the first voltage when the latch data is data for making the threshold voltage of the memory cell another threshold voltage.

Preferably, the write control circuit is provided with one bit's worth of a latch circuit corresponding to every bit line.

Further, preferably, further comprising of a verify read circuit for judging whether or not every write bit is sufficiently written at the time of a write operation.

Further, preferably the first voltage is the ground voltage, and the second voltage is an intermediate voltage between the power supply voltage and the ground voltage.

Further, preferably further provision is made of an input buffer for rearranging externally input multi-bit data and transferring the same to the latch circuit of the write control circuit.

According to a sixth aspect of the present invention, there is provided a method of data programming of a nonvolatile semiconductor memory device having a memory cell in which an amount of charge stored in a charge storage unit changes via a tunnel insulation film according to a voltage supplied to a word line and a bit line, a threshold voltage changes according to that change, and data of a value according to the threshold voltage is stored and writing the multi-bit data into memory cells in units of pages, comprising a step of performing the write operation by setting an electric field applied on the memory cell higher than the other write data in a case where the write data is data for making the threshold voltage of the memory cell to be written in a value furthest from the threshold voltage in an initial erasing state.

According to a seventh of the present invention, there is provided a method of data programming of a nonvolatile semiconductor memory device having a memory cell in which an amount of charge stored in a charge storage unit changes according to a voltage supplied to a word line and a bit line, a threshold voltage changes according to that change, and data of a value according to the threshold voltage is stored and writing the multi-bit data into memory cells in units of pages, comprising a step of performing the write operation by charging the corresponding bit line to a first voltage when the write data is data for making the threshold voltage of the memory cell a value furthest from the threshold voltage in the initial erasing state and by charging this to a second voltage higher than the first voltage when the write data is data for making the threshold voltage of the memory cell another threshold voltage.

According to the present invention, when the write data is data taking a value for making the threshold voltage of the memory cell to be written in a value furthest from the threshold voltage of the initial erasing state, the electric field applied on the memory cell is set higher than that of the other write data and thus the write operations are carried out in parallel.

Specifically, when the write data is data for making the threshold voltage of the memory cell a furthest value from the threshold voltage of the initial erasing state, the corresponding bit line is charged to a first voltage, for example the ground voltage, while when the write data is data for making it another threshold voltage, the bit line is charged to a second voltage higher than the first voltage, for example, an intermediate voltage between the power supply voltage and the ground voltage, for the write operation.

By this, a cell in which the write operation is the slowest is written faster and as a result an entire write time becomes shorter.

BRIEF DESCRIPTION OF THE DRAWINGS

The above object and features of the present invention will be more apparent from the following description of the preferred embodiments given with reference to the accompanying drawings, wherein.

DESCRIPTION OF THE PREFERRED EMBODIMENTS

The preferred embodiments of the present invention will be described in detail next with reference to the related figures.

First Embodiment

Figure 5:
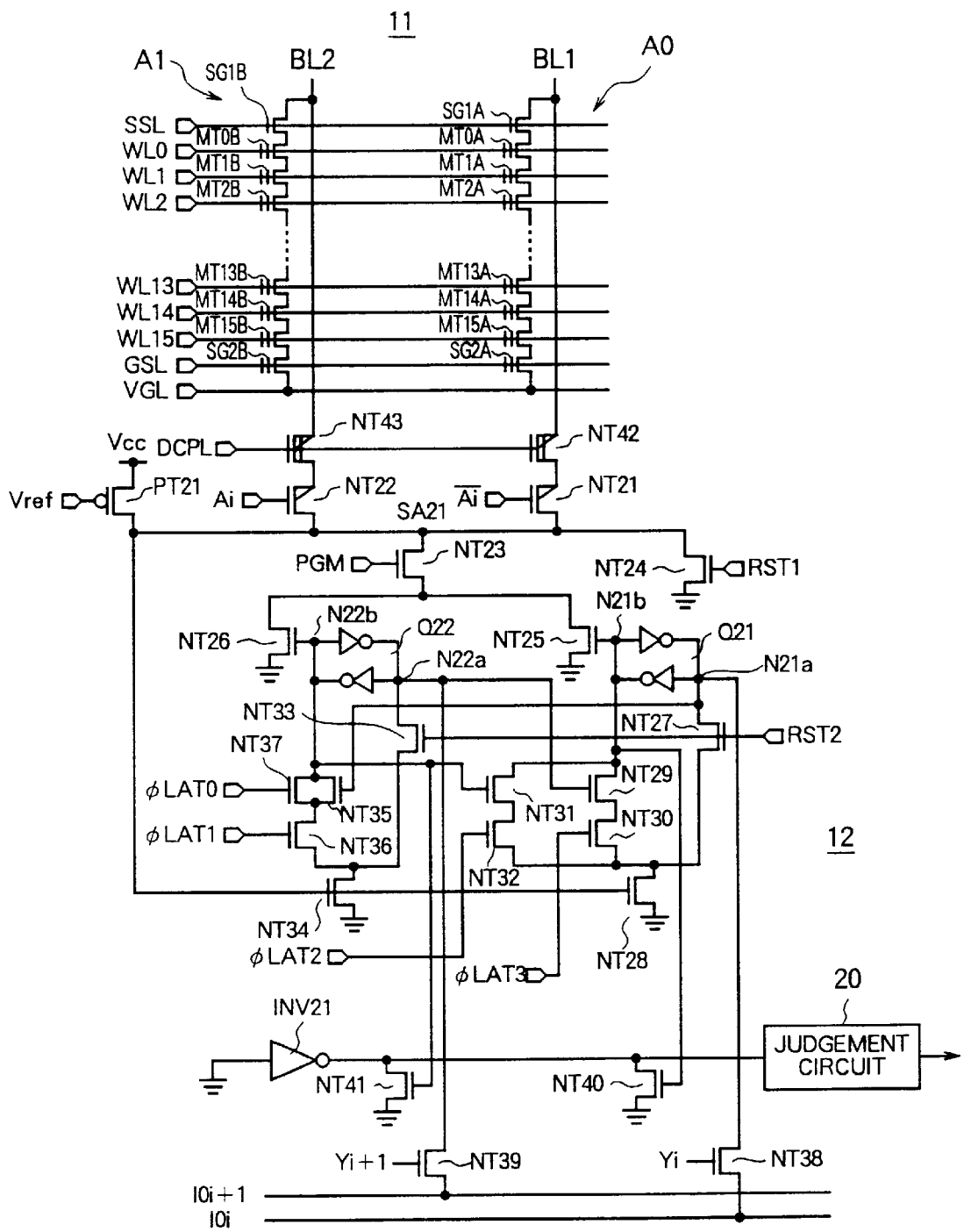
FIG. 5 is a circuit diagram of a first embodiment of a nonvolatile semiconductor memory device according to the present invention.
Figure 6:
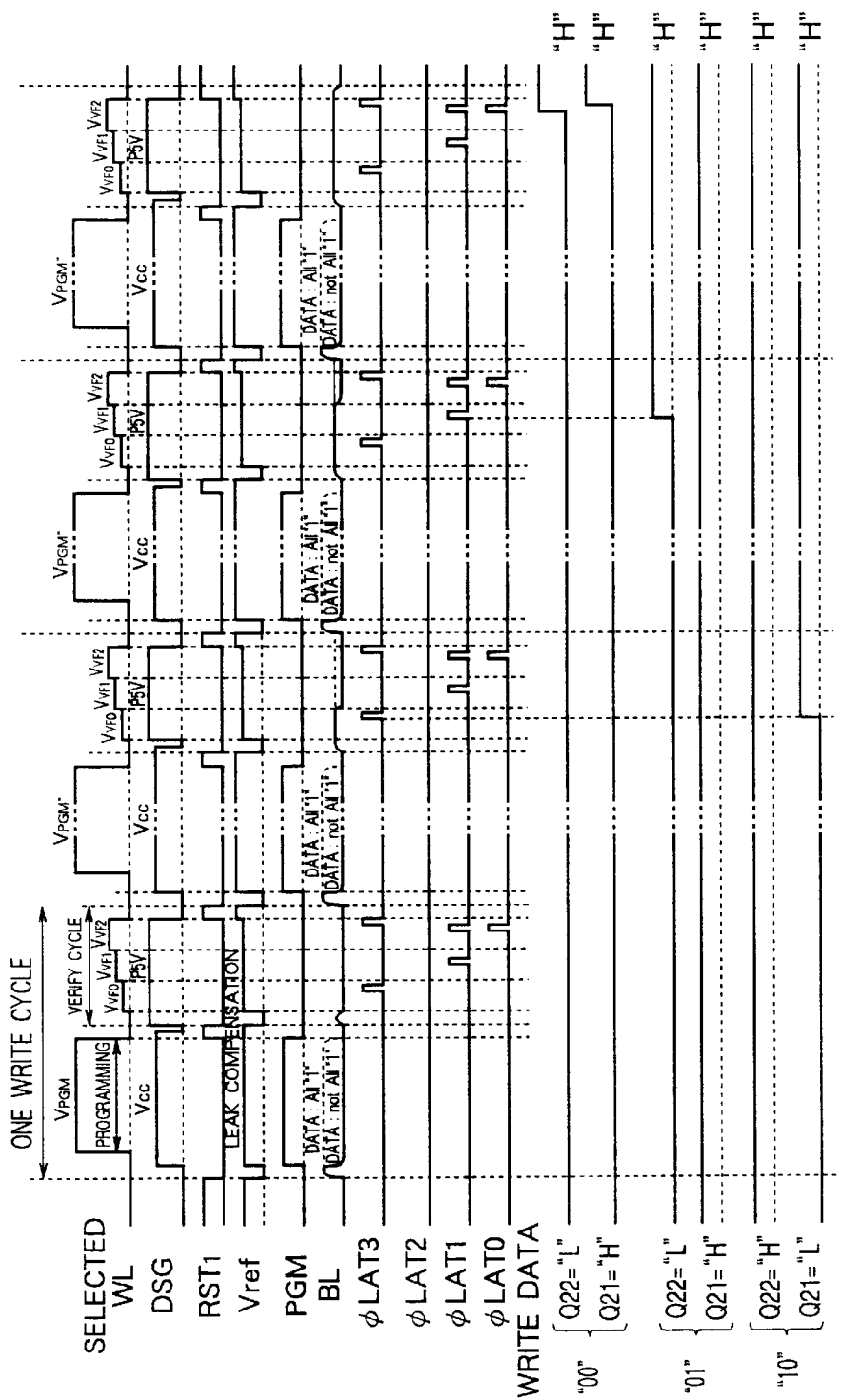
FIGS. 6A to 6M are timing charts for explaining a write operation of the circuit of FIG. 5.

FIG. 5 is a circuit diagram of a first embodiment of a nonvolatile semiconductor memory device according to the present invention. This nonvolatile semiconductor memory device 10 is constituted by a memory array 11, a write/read control circuit 12, and a judgement circuit 20.

The memory array 11 is constituted by, as shown in FIG. 5, memory strings A0 and A1 having memory cells which are connected to common word lines WL0 to WL15. The memory string A0 is connected to a bit line BL1, and the memory string A1 is connected to a bit line BL2.

The memory string A0 comprises a NAND string in which memory cell transistors MT0A to MT15A comprising part of a nonvolatile semiconductor memory device having a floating gate are connected in series, the drain of the memory cell transistor MT0A of this NAND string is connected to the bit line BL1 via the selection gate SG1A, and the source of the memory cell transistor MT15A is connected to the reference voltage line VGL via the selection gate SG2A.

The memory string A1 comprises a NAND string in which memory cell transistors MT0B to MT15B comprising part of a nonvolatile semiconductor memory device having a floating gate are connected in series, the drain of the memory cell transistor MT0B of this NAND string is connected to the bit line BL2 via the selection gate SG1B, and the source of the memory cell transistor MT15B is connected to the reference voltage line VGL via the selection gate SG2B.

The gates of the selection gates SG1A and SG1B are commonly connected to the selection signal supply line SSL, and the gates of the selection gates SG2A and SG2B are commonly connected to the selection signal supply line GSL.

The write/read control circuit 12 is constituted by NMOS transistors NT21 to NT43, a PMOS transistor PT21, an inverter INV21, and latch circuits Q21 and Q22 formed by connecting the input and the output of the inverter.

Between the node SA21 and the bit line BL1, the NMOS transistor 21 and the depletion type NMOS transistor NT42 are connected in series. Between the node SA21 and the bit line BL2, the NMOS transistor 22 and the depletion type NMOS transistor NT43 are connected in series.

An address decode signal Ai is supplied to the gate electrode of the NMOS transistor NT22, and a signal /Ai (/ indicates inversion) is supplied to the gate electrode of the NMOS transistor NT21. Further, the gates of the NMOS transistors NT42 and NT43 are connected to a decouple signal supply line DCPL.

The NMOS transistor NT24 is connected between the node SA21 and the ground line GND, and the PMOS transistor PT21 is connected between the node SA21 and the supply line of the power supply voltage $V_{cc}$. Further, the connection point of the drain of the PMOS transistor PT21 and the node SA21 is connected to the gate electrodes of the NMOS transistors NT28 and NT34.

A reset signal RST1 is supplied to the gate electrode of the NMOS transistor NT24, and a signal Vref is supplied to the gate electrode of the PMOS transistor PT21.

Further, NMOS transistors NT23 and NT25 are connected in series between the node SA21 and the ground line, and the NMOS transistor NT26 is connected between the connection point of the NMOS transistors NT23 and NT25 and the ground line.

A signal PGM is supplied to the gate electrode of the NMOS transistor NT23, the gate electrode of the NMOS transistor NT25 is connected to the second storage node N21b of the latch circuit Q21, and the gate electrode of the NMOS transistor NT26 is connected to the second storage node N22b of the latch circuit Q22.

The NMOS transistors NT27 and NT28 are connected in series between the first storage node N21a of the latch circuit Q21 and the ground line. Further, between the second storage node N21b of the latch circuit Q21 and the connection point of the NMOS transistors NT27 and NT28, NMOS transistors NT29 and NT30 and NMOS transistors NT31 and NT32 which are respectively connected in series are connected in parallel.

NMOS transistors NT33 and NT34 are connected in series between the first storage node N22a of the latch circuit Q22 and the ground line. Further, between the second storage node N22b of the latch circuit Q22 and the connection point of the NMOS transistors NT33 and NT34, NMOS transistors NT35 and NT36 connected in series are connected.

The drain and the source of the NMOS transistor NT37 are connected to the drain and the source of the NMOS transistor NT35.

A reset signal RST2 is supplied to the gate electrodes of the NMOS transistors NT27 and NT33, the gate electrode of the NMOS transistor NT29 is connected to the first storage node N22a of the latch circuit Q22, the gate electrode of the NMOS transistor NT31 is connected to the second storage node N22b of the latch circuit Q22, and the gate electrode of the NMOS transistor NT35 is connected to the first storage node N21a of the latch circuit Q21.

Further, a signal ØLAT3 is supplied to the gate electrode of the NMOS transistor NT30, a signal ØLAT2 is supplied to the gate electrode of the NMOS transistor NT32, a signal ØLAT1 is supplied to the gate electrode of the NMOS transistor NT36, and a signal ØLAT0 is supplied to the gate electrode of the NMOS transistor NT37.

The NMOS transistor NT38 is connected between the first storage node N21a of the latch circuit Q21 and the bus line IOi, and the NMOS transistor NT39 is connected between the first storage node N22a of the latch circuit Q22 and the bus line IOi+1.

Further, the gate of the NMOS transistor NT38 serving as the column gate is connected to the supply line of the signal Yi, and the gate of the NMOS transistor NT39 serving as the column gate is connected to the supply line of the signal Yi+1.

Further, an input terminal of the inverter INV21 is grounded, and an output terminal is connected to the judgement circuit 20. Further, NMOS transistors NT40 and NT41 are connected in parallel between the output terminal of the inverter INV21 and the ground line. The. gate electrode of the NMOS transistor NT40 is connected to the second storage node N21b of the latch circuit Q21, and the gate electrode of the NMOS transistor NT41 is connected to the second storage node N22b of the latch circuit Q22.

The judgement circuit 20 judges whether or not the write operation (programming) is ended with respect to all memory cell transistors by the potential of the output line of the inverter INV21 at the time of a write operation.

Specifically, when the write operation is completed, the first storage nodes N21a and N22a of the latch circuits Q21 and Q22 become the power supply voltage $V_{cc}$ level, and the second storage nodes N21b and N22b become the ground level. As a result, the NMOS transistors NT40 and NT41 are held in the non-conductive state, the potential of the output line of the inverter INV21 becomes the power supply voltage $V_{cc}$ level, and, by this, it is judged that the write operation is ended.

On the other hand, when there is a cell which is not sufficiently written, either or all of the first storage nodes N21a and N22a of the latch circuits Q21 and Q22 become the ground level, and the second storage nodes N21b and N22b become the power supply voltage $V_{cc}$ level. As a result, the NMOS transistor NT40 or NT41 or both transistors are held in the conductive state, and the potential of the output line of the inverter INV21 becomes the ground level. By this it is judged that there is a cell which was not sufficiently written.

Next, an explanation will be made of the write, verify read, and read operation by the above structure in that order with reference to the drawings.

First, an explanation will be made of the write operation with reference to the timing charts of FIGS. 6A to 6M.

Before the start of the write operation, the signal Vref is set at the low level, and the PMOS transistor PT21 is held in the conductive state. By this, all bit lines are charged to the power supply voltage $V_{cc}$.

At this time, to avoid the influence upon the latch data, signals PGM and ØLAT0 to ØLAT3 for controlling read/verify operation are set at the ground level (low level), and the NMOS transistor NT23 and NMOS transistors NT30, NT32, NT36, and NT37 are held in the non-conductive state.

Then, at this time, the address decode signal Ai and the inverted signal /Ai thereof are controlled to the voltage of Vcc+Vthh(B) (Vthh(B): voltage obtained when the influence of the back bias effect is added to Vth of a high withstand voltage transistor) or more, and the signal DCPL for controlling the high withstand voltage depletion type transistors NT42 and NT43 is controlled to the power supply voltage $V_{cc}$ level.

By this, the NMOS transistors NT21, NT22, NT42, and NT43 become the conductive state, and as a result, both of the bit lines BL1 and BL2 are charged to the power supply voltage $V_{cc}$.

Thereafter, one of the address decode signals Ai and /Ai is set at the ground level based on the selection information of the address.

Here, an explanation will be made assuming that the bit line BL2 is selected and taking as an example a case where the address decode signal Ai is set at a high level, and the inverted signal /Ai thereof is set at the ground level.

At this time, the NMOS transistor NT21 becomes the non-conductive state, therefore the bit line BL1 becomes the floating state at the power supply voltage $V_{cc}$ level.

Thereafter, the signal Vref is switched to the power supply voltage $V_{cc}$ level and the so-called precharge use PMOS transistor PT21 is held in the non-conductive state, the signal PGM is switched to the power supply voltage $V_{cc}$ level and the NMOS transistor NT23 is held in the conductive state, and the selection signal supply line SSL connected to the gate electrodes of the selection gates SG1A and SG1B on the drain side of the memory cell is set at the power supply voltage $V_{cc}$ level.

At this time, in cases other than the case where the write data is "11", at least one of the second storage nodes N21b and N22b of the latch circuits Q21 and Q22 has become the high level, and at least one of the NMOS transistors NT25 and NT26 is held in the conductive state. For this reason, the bit line is discharged to the ground level.

Note that the bit line is discharged by the NMOS transistor using the inverted signal of the latch data as the gate input, therefore there is no effect upon the latch data even if the discharge is abruptly carried out.

When the write data is "11", both of the NMOS transistors NT25 and NT26 are held in the non-conductive state, so the bit line voltage is held at the precharge voltage $V_{cc}$.

In this stage, in cases other than the case where the write data is "11", if the bit line and the channel of memory cell are at the ground level and the write data is "11", the bit line becomes $V_{cc}$, the channel of the memory cell becomes the voltage of $V_{cc}$—VthDSG(B) or less, the bit line on the non-selected bit line "BL1" side becomes $V_{cc}$, and the channel of the memory cell becomes the voltage of $V_{cc}$—VthDSG(B) or less.

Here, the word line is raised to the drive voltage and the operation routine enters the write operation while holding the NMOS transistor NT23 in the conductive state as it is.

At this time, when the write data has a value other than "11", due to the electric field by the word line voltage VPGM and the channel voltage 0 V, Fowler-Nordheim tunneling (hereinafter referred to as an FN tunnel) phenomenon occurs and the write operation of the cell occurs. Namely, the data is written into cells having the write data of "00", "01", and "10".

When the write data is "11", in a memory cell on the non-selected bit line BL1 side, the channel voltage is boosted up by the capacity coupling due to the rising of the word line voltage. By this, the channel is cut off from the bit line BL1 by the selection gate SG1A on the drain side.

Then, at the stage where the rising of the word line is completed, the channel becomes the inhibit voltage, the FN tunnel phenomenon does not occur, and the cell is held in the erasing state.

Here, in the case where the write data is "11" and in the case of a cell of the non-selected bit line BL1 side, the bit line BL1 is in a floating state, therefore there is the concern that the bit line voltage may fall due to leakage. When the bit line voltage becomes $V_{cc}$—VthDSG(B) or less, the selection gate on the drain side becomes on, and the channel voltage instantaneously falls from the boost voltage (about 8 V) to $V_{cc}$—VthDSG(B) by the capacitance ratio of the bit line and channel ($C_{BL} >> C_{chn}$).

By this, an electric field large enough to cause an FN tunnel phenomenon is applied between the floating gate and the channel, and write operation occurs.

However, the threshold voltage Vth of the selection gate on the drain side is usually set relatively high, and the threshold voltage Vth in a state where the back bias is applied has become at least 1.5 V or more. Even if the power supply voltage $V_{cc}$ is 3 V, this phenomenon does not occur unless a voltage drop of 1.5 occurs.

On the other hand, one write time is 10 μs to 20 μs. When there is leakage resulting in a drop of the voltage of as high as 1.5 V, this means that reading is impossible in a NAND type flash memory which performs a read operation on the μs order.

From the above, a phenomenon where the bit line voltage falls due to leakage and a write operation occurs in a write inhibit cell cannot occur.

When the write operation is ended, first, simultaneously with the boost down of the word line to 0 V, the signal DCPL is set at the ground level, the reset signal RST1 is set at a high level, charges of the bit line and the channel are discharged, and after a while, the voltage supplied to the selection signal supply line SSL to which the selection gate on the drain side is connected is boosted down.

By this, one write operation is ended, and the operation routine shifts to the verify read operation.

As described above, by performing the write operation by the wired-OR of the write data, the write operation is simultaneously started for memory cells requiring a write operation.

Figure 7:
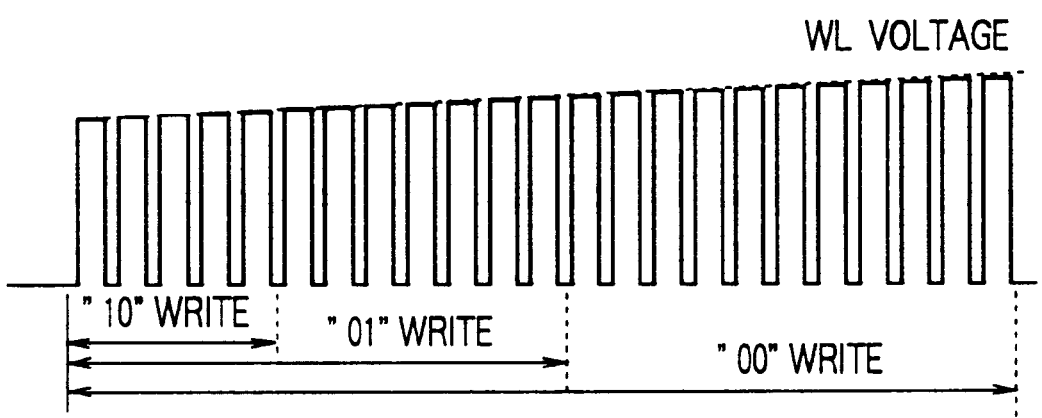
FIG. 7 is a view of a write sequence of the circuit of FIG. 5.

By this, it is not necessary to boost down the ISPP voltage when switching the steps as in the related art, therefore, as shown in FIG. 7, the number of ISPP pulses until the final word line voltage is reached is reduced and consequently shortening of the write time is realized.

Figure 8:
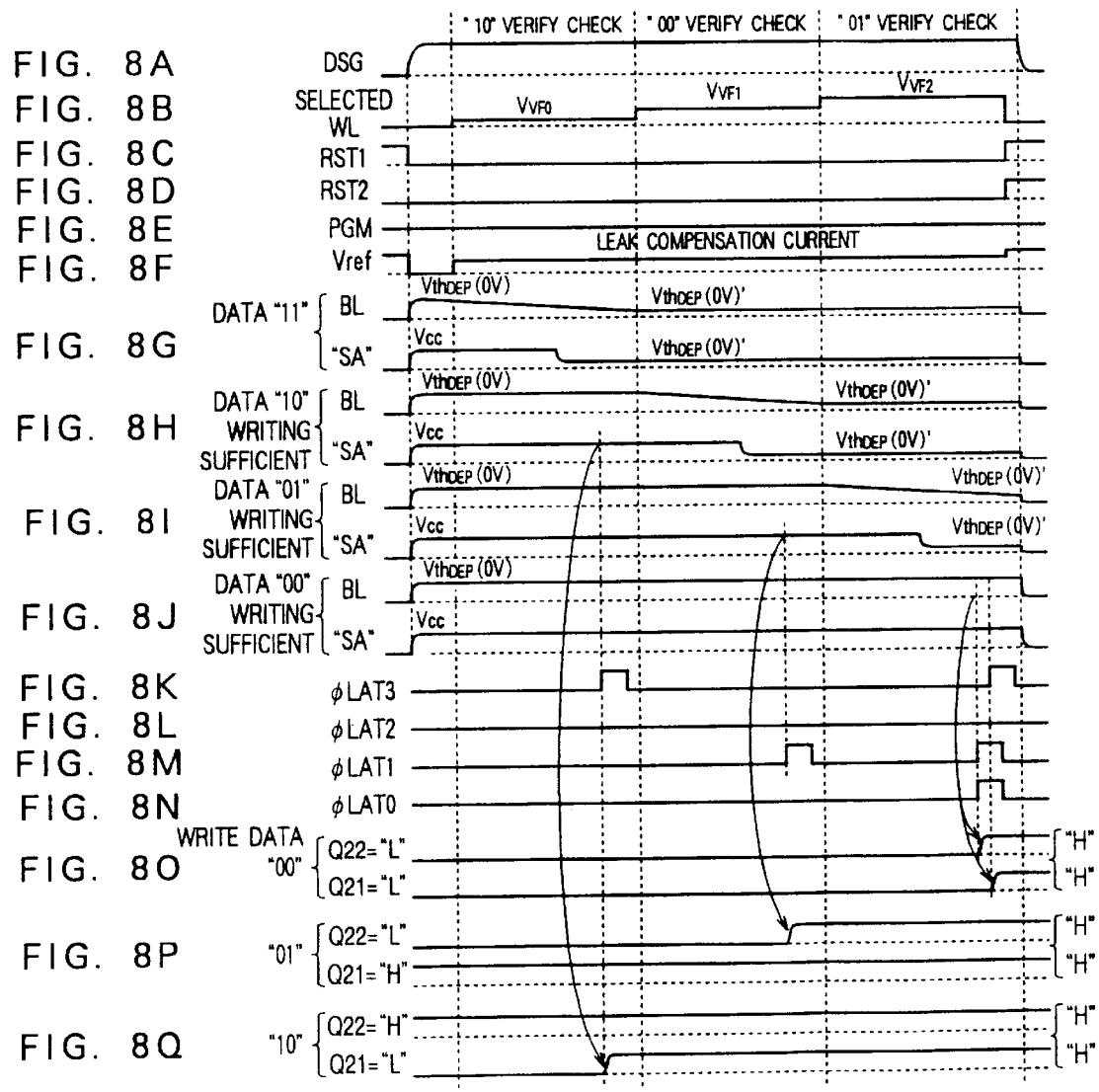
FIGS. 8A to 8Q are timing charts for explaining a verify read operation of the circuit of FIG. 5.

Next, an explanation will be made of the verify read operation with reference to the timing charts of FIGS. 8A to 8Q.

In a verify operation, a write check operation of "00", "01", and "10" is carried out whenever one write operation is ended.

In the present embodiment, if the verify operation is carried out from the high level as in the related art (in the order of the word line voltage of VVF2→VVF1→VVF0), it becomes necessary to charge the bit line again between verify operations, therefore, by performing the verify operation from a low level (in the order of the word line voltage of VVF0→VVF1→VVF2), the number of bit line charging is reduced to one, and the verify time is shortened. Note that, VVF0, VVF1, and VVF2 are verify use word line voltages.

Below, the verify operation will be explained in further detail.

First, the signal Vref is set at the ground level with the signal DCPL held at the ground level, the PMOS transistor PT21 is held in the conductive state, and the bit line is charged to VthDEP (0 V) (threshold voltage Vth of the depletion type transistor having a gate which is set at 0 V).

Simultaneously with this, the voltage of the selection signal supply line SSL to which the gate electrodes of the selection gates SG1A and SG1B on the drain side are connected is set at the same voltage as the non-selected word line voltage of the selected string (P5V: certain voltage of 5.0 to 6.0 V).

At the stage where the charging is completed, the bit line is charged to VthDEP (0 V), the node SA21 is charged to the power supply voltage $V_{cc}$, and the depletion type transistors NT42 and NT43 automatically become the non-conductive state.

Here, the signal Vref is set at a voltage where the PMOS transistor PT21 can pass a current large enough to compensate for the leaked current of the bit line, P5V is supplied to the word lines of the non-selected memory cells, and VVF0 is supplied to the word line of the selected cell.

At this time, if the threshold voltage Vth of the memory cell is the word line voltage VVF0 or more, the cell current does not flow, therefore the bit line is held at VthDEP (0 V) and the node SA21 is held at the power supply voltage $V_{cc}$.

On the other hand, if the threshold voltage Vth of the memory cell is the word line voltage VVF0 or less, the cell current flows and the bit line voltage falls, the depletion type transistors NT42 and NT43 become the conductive state, a redistribution of the charges between the bit line and the node SA21 occurs, and the voltage of the node SA21 abruptly falls to about VthDEP (0 V)' (←voltage slightly fallen from the bit line precharge voltage VthDEP (0 V)).

Here, when the signal ØLAT3 is set at a high level, the NMOS transistor NT30 is held in the conductive state.

At this time, when the write data is "10", the first storage node N22a of the latch circuit Q22 is at high level, the NMOS transistor NT29 is in the conductive state, and the node SA21 is held at the power supply voltage $V_{cc}$ (Vth>VVF0: writing is sufficient), the NMOS transistor NT28 is held in the conductive state.

As a result, the second storage node N21b of the latch circuit Q21 is pulled to the ground level, and the first storage node N21a of the latch circuit Q21 switches from the low level to high level.

By this, the latch data of the latch circuits Q22 and Q21 become "11", and there is no write operation by the rewriting after this.

On the other hand, when the node SA21 is VthDEP (0 V) or the write data is "01" or "00", the NMOS transistor NT28 or NT29 is held in the non-conductive state, therefore there is no change in the latch data. For this reason, there is a write operation at the time of rewriting.

Namely, when the verify operation is carried out at the word line voltage VVF0, if the threshold voltage is larger than the word line voltage (Vth>VVF0), the latch data "10" of the latch circuits Q22 and Q21 changes (inverted) to "11". There is no change in the latch data in cases other than this.

Next, the word line is set at VVF1 and the verify read operation is carried out. After an elapse of a predetermined time, the signal ØLAT1 is set at a high level. By this, the NMOS transistor NT36 is held in the conductive state.

At this time, when the write data is "01", the first storage node N21a of the latch circuit Q21 is at a high level, so the NMOS transistor NT35 is held in the conductive state. If the node SA21 is held at the power supply voltage $V_{cc}$ (Vth>VVF1: writing is sufficient), the NMOS transistor NT34 is held in the conductive state.

As a result, the second storage node N22b of the latch circuit Q22 is pulled to the ground level, and the first storage node N22a of the latch circuit Q22 switches from a low level to high level.

By this, the latch data of the latch circuits Q22 and Q21 becomes "11", and there is no write operation in the following rewriting.

On the other hand, when the node SA21 is at VthDEP (0 V) or the write data is "00" or "10", the NMOS transistor NT34 or NT35 is held in the non-conductive state, therefore there is no change in the latch data. For this reason, there is a write operation at the time of rewriting.

Namely, when the verify operation is carried out at the word line voltage VVF1, if the threshold voltage is larger than the word line voltage (Vth>VVF1), the latch data "01" of the latch circuits Q22 and Q21 changes (inverted) to "11". There is no change in the latch data in cases other than this.

Finally, the word line voltage is set at VVF2, and the verify read operation is carried out. After an elapse of a predetermined time, the signals ØLAT1 and ØLAT0 are set at a high level, then the signal ØLAT3 is set at a high level. By this, the NMOS transistors NT36 and NT37 are held in the conductive state, and the NMOS transistor NT30 is held in the conductive state.

At this time, when the write data is "00", if the node SA21 has been held at the power supply voltage $V_{cc}$ (Vth>VVF2: writing is sufficient), the NMOS transistors NT34 and NT28 are held in the conductive state.

As a result, the second storage node N22b of the latch circuit Q22 is pulled to the ground level, and the first storage node N22a of the latch circuit Q22 switches from a low level to high level. By this, the NMOS transistor NT29 is held in the conductive state.

Thereafter, when the signal ØLAT3 is set at a high level, the NMOS transistor NT30 is held in the conductive state as mentioned above.

As a result, the second storage node N21b of the latch circuit Q21 is pulled to the ground level, and the first storage node N22a of the latch circuit Q21 switches from a low level to high level.

By this, the latch data of the latch circuits Q22 and Q21 becomes "11", and there is no write operation in the following rewriting.

On the other hand, where the node SA21 is VthDEP (0 V), the NMOS transistors NT34 and NT28 are held in the non-conductive state, therefore there is no change in the latch data. For this reason, there is a write operation at the time of rewriting.

Namely, when the verify operation is carried out at the word line voltage VVF2, if the threshold voltage is larger than the word line voltage (Vth>VVF2), the latch data "00" of the latch circuits Q22 and Q21 changes (inverted) to "11". There is no change in the latch data in cases other than this.

After the three step verify operation is ended, if all cells have become sufficiently written, the first storage nodes N21*a* and N22*a* of all latch circuits Q22 and Q21 have become the high level.

After the end of the verify read operation, if sufficiently written, the second storage nodes N21*b* and N22*b* of the latch circuits Q21 and Q22 become the ground level. As a result, the NMOS transistors NT40 and NT41 are held in the non-conductive state, and the potential of the output line of the inverter INV21 becomes the power supply voltage $V_{cc}$ level. By this, it is judged that the write operation is ended.

On the other hand, when there is a cell which is not sufficiently written, either or all of first storage nodes N21*a* and N22*a* of the latch circuits Q21 and Q22 become the ground level, and the second storage nodes N21*b* and N22*b* become the power supply voltage $V_{cc}$ level. As a result, the NMOS transistor NT40 or NT41 or both transistors are held in the conductive state, and the potential of the output line of the inverter INV21 becomes the ground level. By this, it is judged that there is a cell which has not be sufficiently written.

Figure 9:
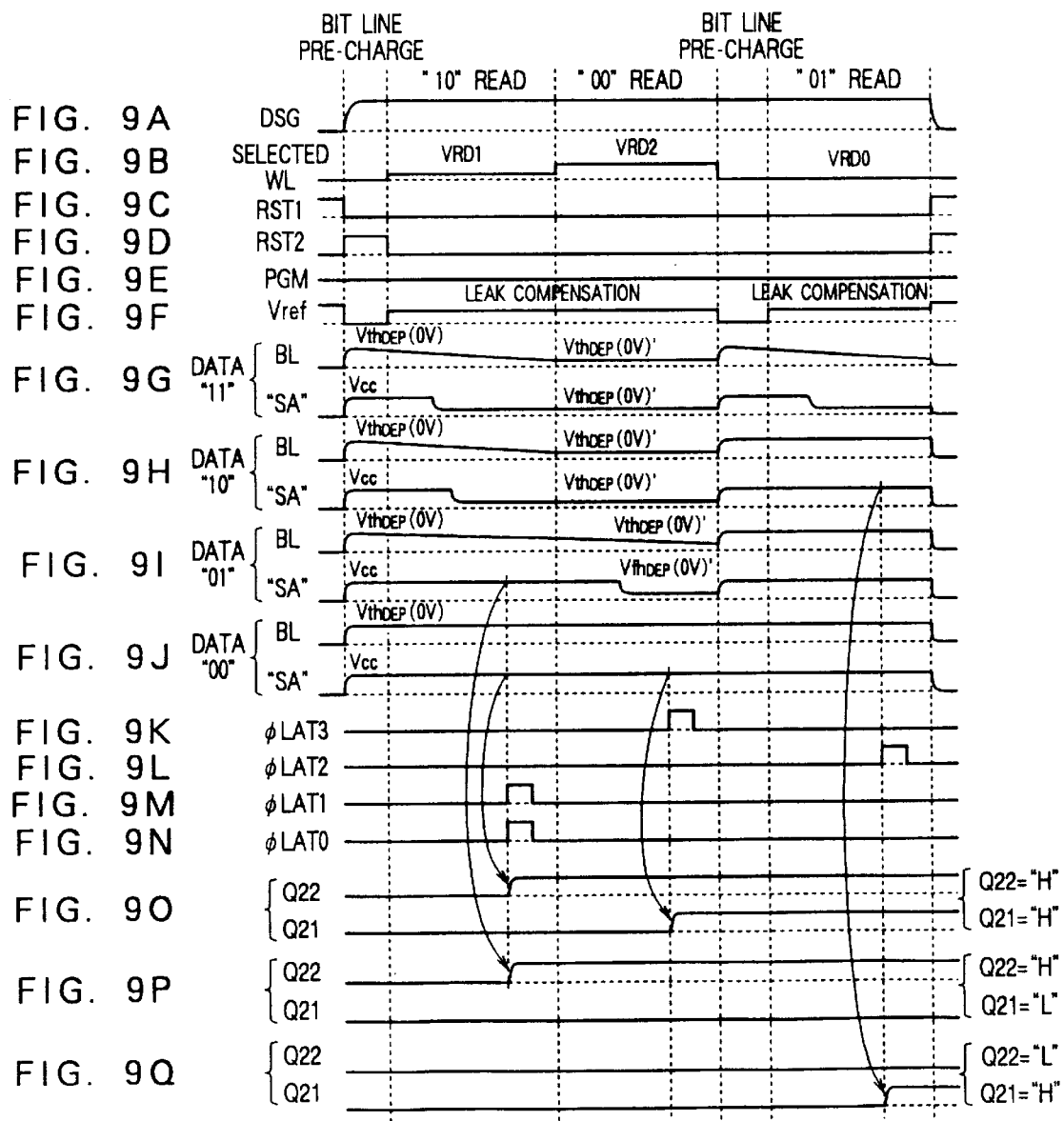
FIGS. 9A to 9Q are timing charts for explaining the read operation of the circuit of FIG. 5.

Next, an explanation will be made of a read operation with reference to the timing charts of FIGS. 9A to 9Q.

In the usual read operation, the signal DCPL is set at the ground level preceding the read operation, one of the address decode signals Ai and /Ai is set at the power supply voltage $V_{cc}$, the signal Vref is set at the ground level, the selected bit line is precharged to VthDEP (0 V), the node SA21 is precharged to the power supply voltage $V_{cc}$, and simultaneously with this, the reset signal RST2 is set at a high level and the latch data of the latch circuits Q22 and Q21 are reset to a low level.

Figure 1:
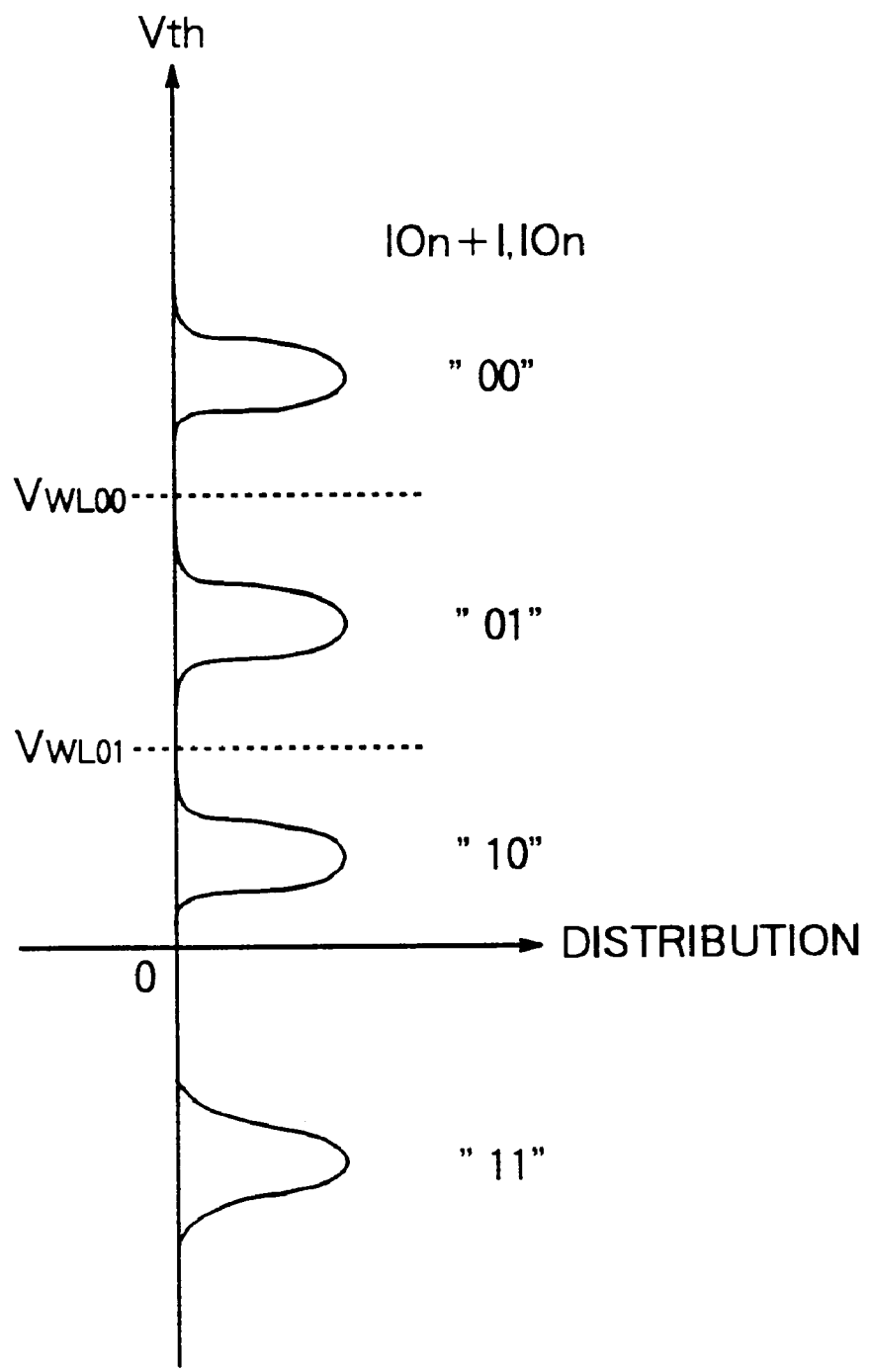
FIG. 1 is a view of the relationship between a threshold voltage Vth level and data content when data consisting of 2 bits and taking 4 values is recorded in one memory transitor in a NAND type flash memory.

Here, where the read operation is carried out while switching the selected word line voltage in the order of VRD0→VRD1→VRD2 similar to that at the verify operation at the time of a usual read operation, in the read operation at the word line voltage VRD0, at the distribution 0 to distribution 2 of FIG. 1, the node SA21 is at about the power supply voltage $V_{cc}$, and the read operation of the latch data of the latch circuit Q21 can not be carried out. This is because, at the distribution 1, it is intended to set the latch data of the latch circuit Q21 at a low level, but it is inverted to a high level.

However, where the read operation is carried out while switching the selected word line voltage in the order of VRD2→VRD1→VRD0, in the cells having the distribution 2, the voltage of the bit line and the node SA21 falls since the memory cell becomes an on state at the read operation of the word line voltages VRD2 and VRD1, therefore precharging becomes necessary for every verify operation (twice in total).

Therefore, in the present embodiment, the read operation is carried out by switching the selected word line voltage in the order of VRD1→VRD2→VRD0.

By this, the intended inversion of the latch data can be reliably carried out in each verify step, the number of times of re-precharging becomes one time between read operations at the word line voltage VRD2 and the word line voltage VRD0, and the read time is shortened.

As explained above, after the precharging of the bit line/node SA21 and the reset of the latch circuits Q22 and Q21 are ended, the non-selected word lines are set at P5V, and the selected word line is set at VRD1. After an elapse of the predetermined time, the signals ØLAT1 and ØLAT0 are set at a high level, and the NMOS transistors NT36 and NT37 are held in the conductive state and the read operation is carried out.

At this time, if memory cells have the distribution 3 and the distribution 2, no cell current flows, so the node SA21 is held at about the power supply voltage $V_{cc}$, and the NMOS transistor NT34 is held in the conductive state.

As a result, the second storage node N22*b* of the latch circuit Q22 is pulled to the ground level, and the first storage node N22*a* of the latch circuit Q22 switches from a low level to high level.

On the other hand, when the memory cells have the distribution 1 and the distribution 0, a cell current flows and the node SA21 falls to VthDEP (0 V)'.

Therefore, even if the signals ØLAT1 and ØLAT0 are set at a high level and the NMOS transistors NT36 and NT37 are held in the conductive state, the NMOS transistor NT34 is held in the non-conductive state, therefore the latch data of the latch circuit Q22 does not change.

Namely, the latch data when performing the read operation at the selected word line voltage VRD1 become as follows:

Distribution 3, 2: {Q22, Q21}={H, L}
Distribution 1, 0: {Q22, Q21}={L, L}

Next, the selected word line voltage is raised to VRD2 while the bit line and node SA21 are left without being precharged as they are. After the elapse of a predetermined time, the signal ØLAT3 is set at a high level, the NMOS transistor NT30 is held in the conductive state, and the read operation is carried out.

Note that, at this stage, the bit line with the distribution 3 or 2 is held at VthDEP (0 V), and the node SA21 is held at the power supply voltage $V_{cc}$. On the other hand, at the distributions 1 and 0, the bit line and the node SA21 have become about VthDEP (0 V), but even if the bit line and the node SA21 are precharged again, if the read operation is carried out at the selected word line voltage VRD2, the node SA21 falls to about VthDEP (0 V) again. For this reason, even if the read operation is carried out at the selected word line voltage VRD2 without performing the precharging again, there is no influence upon the result of the read operation.

At this time, the voltage of the node SA21 is originally about VthDEP (0 V) at the distribution 1 or 0, and the voltage of the node SA21 becomes about VthDEP (0 V) even at the distribution 2 since the cell current flows.

On the other hand, since the cell current does not flow at the distribution 3, the node SA21 is held at about the power supply voltage $V_{cc}$.

Here, when the signal ØLAT3 is set at a high level, the second storage node N21*b* of the latch circuit Q21 is pulled to the ground level by the route of the NMOS transistors NT29, NT30, and NT28, and the latch data of the latch circuit Q21 switches from a low level to high level.

On the other hand, if cells have the distributions 2 to 0, the node SA21 falls to VthDEP (0 V), therefore even if the signal ØLAT3 is set at a high level, the NMOS transistor NT 28 is held in the non-conductive state, so the latch data of the latch circuit Q21 does not change.

Namely, the latch data when performing a read operation at the selected word line voltage VRD2 become as follows:

Distribution 3: {Q22, Q21}={H, H}
Distribution 2: {Q22, Q21}={H, L}
Distribution 1, 0: {Q22, Q21}={L, L}

Finally, simultaneously with the set up of the selection word line voltage at VRD0, the signal Vref is set at 0 V, and the bit line and the node SA21 are precharged again.

Then, after the elapse of a predetermined time, the signal ØLAT3 is set at a high level and the read operation is carried out.

At this time, the cell current does not flow at the distributions 3 to 1, so the node SA21 is held at about the power supply voltage $V_{cc}$.

On the other hand, the cell current flows only in the case of the distribution 0, and the node SA21 falls to about VthDEP (0 V). Here, when the signal ØLAT2 is set at a high level, when the second storage node N22b of the latch circuit Q22 is at a high level, that is, at the distributions 1 and 0, the node SA21 is at a high level (distribution 1), the NMOS transistors NT31, NT32 and NT28 are held in the conductive state, the second storage node N21b of the latch circuit Q21 is pulled to the ground level, and the latch data of the latch circuit Q21 switches from a low level to high level.

In cases other than this, the NMOS transistor NT31 or NT28 is held in the non-conductive state, and the latch data of the latch circuit Q21 does not change.

Namely, the latch data when performing the read operation at the selected word line voltage VRD1 become as follows:

Distribution 3: {Q22, Q21}={H, H}
Distribution 2: {Q22, Q21}={H, L}
Distribution 1: {Q22, Q21}={L, H}
Distribution 0: {Q22, Q21}={L, L}

The read operation is ended by the above.

As explained above, according to the first embodiment, after all bit line voltages are charged to the power supply voltage $V_{cc}$ before the write operation, by discharging the bit line via the NMOS transistors NT25 and NT26 having gate electrodes which are connected to the second storage nodes N21b and N22b of the latch circuits Q21 and Q22, the charging of the bit line is carried out at high speed. By making the bit line voltage connected to the write inhibit voltage the power supply voltage $V_{cc}$, the threshold voltage Vth of the selection gate on the drain side falls and, a margin is given with respect to the self boost, and write operations are carried out in parallel, whereby there are the advantages that the bit line charging time before the data write operation is shortened, and consequently the entire write time can be shortened and the verify read operation and the usual read operation can be carried out at a high speed.

Second Embodiment

Figure 10:
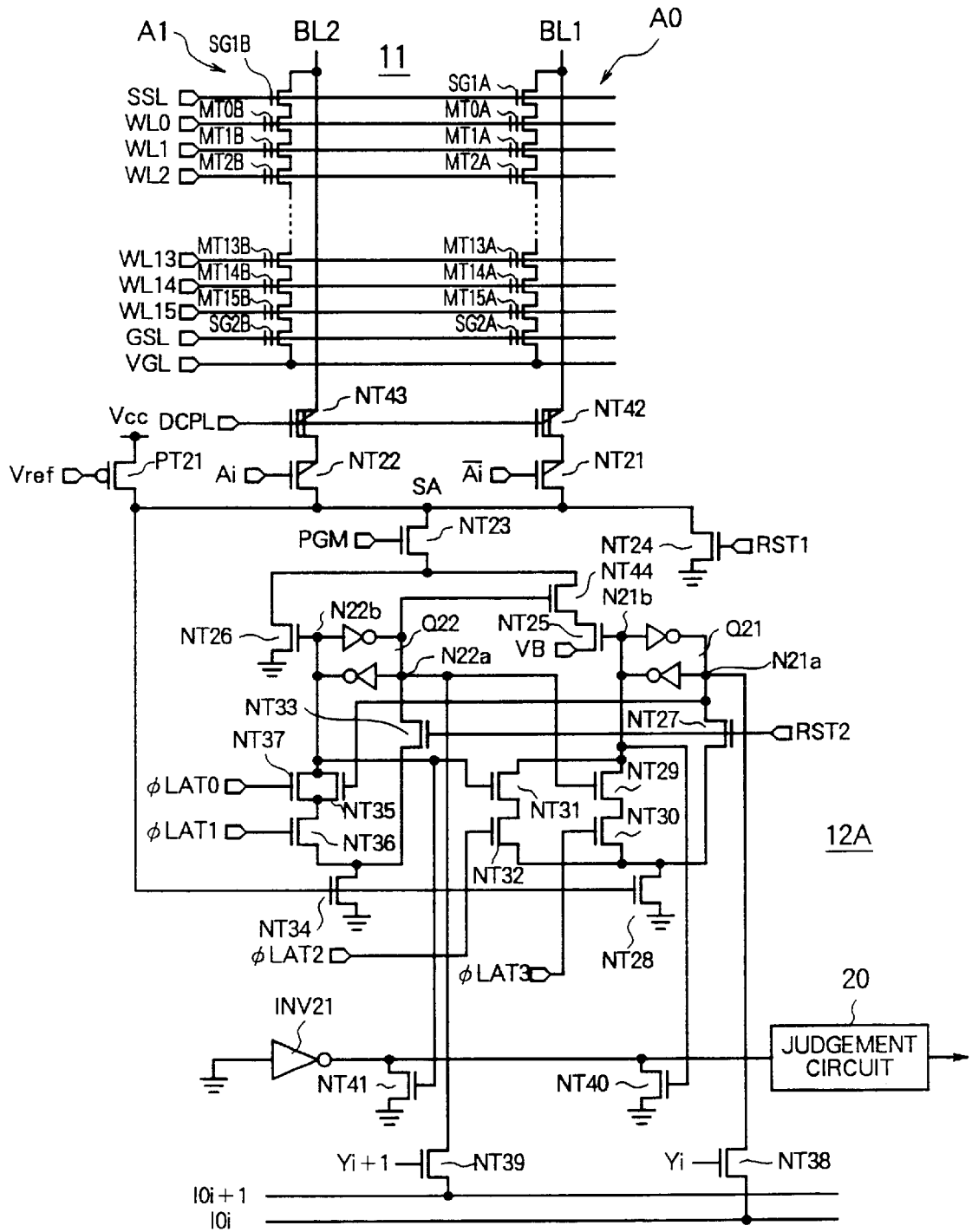
FIG. 10 is a circuit diagram of a second embodiment of a nonvolatile semiconductor memory device according to the present invention.

FIG. 10 is a circuit diagram of a second embodiment of the nonvolatile semiconductor memory device according to the present invention.

The difference of the second embodiment from the first embodiment resides in that an NMOS transistor NT44 is connected between the NMOS transistors NT23 and NT25, the gate electrode of the NMOS transistor NT44 is connected to the first storage node N22a of the latch circuit Q22, and further the source of the NMOS transistor NT25 is connected to not the ground line, but the voltage source of a positive certain voltage VB (0<VB<Vcc - VthDSG(B)).

In the second embodiment, the bit line voltage at the time of a write operation is controlled in this part.

The rest of the structure is similar to that of the circuit of FIG. 5.

In such a structure, when the latch data of the latch circuits Q22 and Q21 is {Q22, Q21}={H, H} and the write data is "11", both of second storage nodes N21b and N22b of the latch circuits Q21 and Q22 are at a low level, therefore both of the NMOS transistors NT25 and NT26 are held in the non-conductive state, and the bit line voltage is held at the power supply voltage $V_{cc}$.

When the latch data of the latch circuits Q22 and Q21 are {Q22, Q21}={H, L} and the write data is "10", the second storage node N21b of the latch circuit Q22 is at low level, and the first storage node N22a of the latch circuit Q22 and the second storage node N21b of the latch circuit Q21 are at a high level, therefore the NMOS transistor NT26 is held in the non-conductive state, the NMOS transistors NT44 and NT25 are held in the conductive state, and the bit line voltage becomes VB.

Where the latch data of the latch circuits Q22 and Q21 is {Q22, Q21}={L, H} and {L, L} and the write data is "01" and "00", the first storage node N22a of the latch circuit Q22 is at a low level and the second storage node N22a of the latch circuit Q22 is at a high level, therefore the NMOS transistor NT44 is held in the non-conductive state, the NMOS transistor NT26 is held in the conductive state, and the bit line voltage becomes the ground level.

When the word line is raised after setting the bit line at the above voltage, the channel voltage becomes as follows.

Namely, when the latch data of the latch circuits Q22 and Q21 is {Q22, Q21}={H, H} and the write data is "11", the channel is boosted to the write inhibit voltage (about 8 V) by a self boost.

When the latch data of the latch circuits Q22 and Q21 is {Q22, Q21}={H, L} and the write data is "10", the channel voltage becomes VB.

When the latch data of the latch circuits Q22 and Q21 is {Q22, Q21}={L, H}, {L, L} and the write data is "01" and "00", the channel voltage becomes the ground level.

At this time, when the word line voltage at the start of the write operation is VPGM+VB, the voltage supplied between the gate and the channel of the cell having the write data of "10" is VPGM and does not change from that of the related art.

On the other hand, the voltage supplied between the gate and the channel of the cell having the write data of "01" or "00" becomes VPGM+VB, and a higher electric field than that of the related art is applied between the floating gate and the channel.

However, where the write data is "01" or "00", the write level is high, therefore a situation where the write level suddenly exceeds the judgement level at the first write operation is difficult to conceive of even in a memory cell having a fast write speed.

Figure 11:
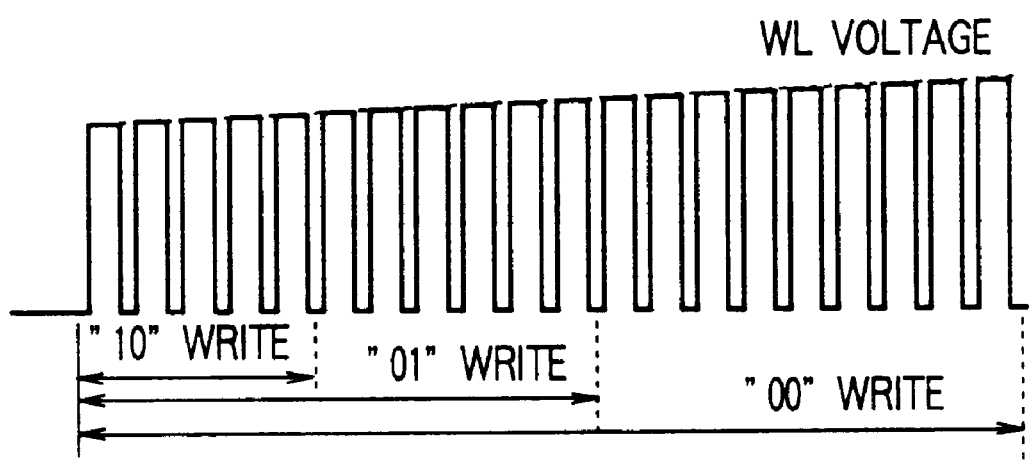
FIG. 11 is a view of the write sequence of the circuit of FIG. 10.

Further, when the step width of ISPP is defined as ΔV, in comparison with the first embodiment, the write operation of the write data "01" and "00" becomes equivalent to the start of the write operation from the ISPP write pulse previous by exactly VB/ΔV in FIG. 11. On the other hand, the cell of the write data of "00" defines the entire write time, therefore the entire write, time is further shortened in comparison with the first embodiment (refer to FIG. 11).

Third Embodiment

Figure 12:
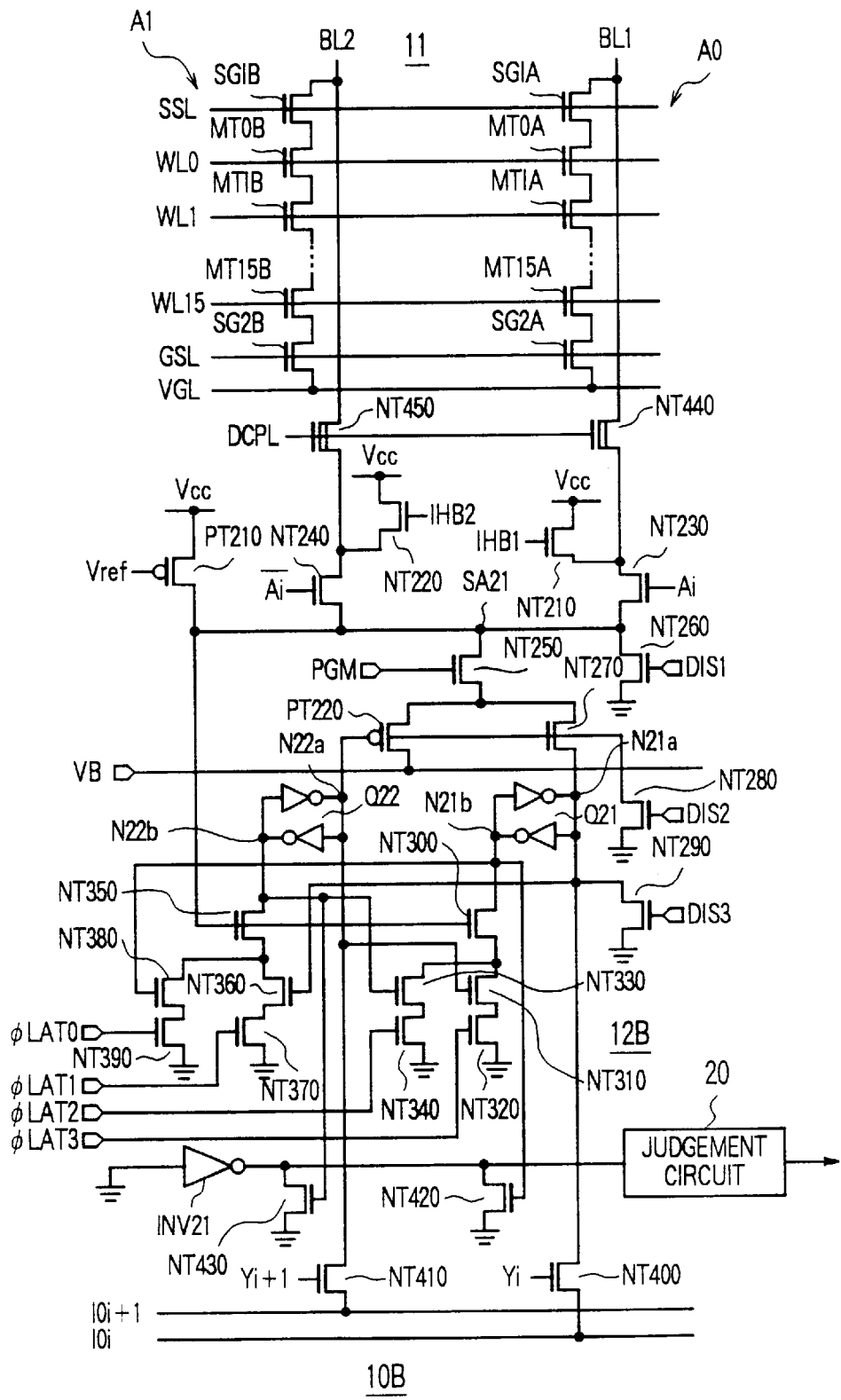
FIG. 12 is a circuit diagram of a third embodiment of a nonvolatile semiconductor memory device according to the present invention.

FIG. 12 is a circuit diagram of a third embodiment of a nonvolatile semiconductor memory device according to the present invention. This nonvolatile semiconductor memory device 10B is constituted by a memory array 11, write/read control circuit 12B, and judgement circuit 20.

The memory array 11 is constituted by, as shown in FIG. 12, memory strings A0 and A1 having memory cells which are connected to common word lines WL0 to WL15. The memory string A0 is connected to the bit line BL1, and the memory string A1 is connected to the bit line BL2.

The memory string A0 comprises a NAND string in which memory cell transistors MT0A to MT15A comprising part of a nonvolatile semiconductor memory device having a floating gate are connected in series, the drain of the memory cell transistor MT0A of this NAND string is connected to the bit line BL1 via the selection gate SG1A, and the source of the memory cell transistor MT15A is connected to the reference voltage line VGL via the selection gate SG2A.

The memory string A1 comprises a NAND string in which memory cell transistors MT0B to MT15B comprising part of a nonvolatile semiconductor memory device having a floating gate are connected in series, the drain of the memory cell transistor MT0B of this NAND string is connected to the bit line BL2 via the selection gate SG1B, and the source of the memory cell transistor MT15B is connected to the reference voltage line VGL via the selection gate SG2B.

The gates of the selection gates SG1A and SG1B are commonly connected to the selection signal supply line SSL, and the gates of the selection gates SG2A and SG2B are commonly connected to the selection signal supply line GSL.

The write/read control circuit 12B is constituted by NMOS transistors NT210 to NT450, PMOS transistors PT210 and PT220, an inverter INV21, and latch circuits Q21 and Q22 obtained by connecting the input and the output of the inverter.

The NMOS transistor NT210 is connected between the supply line of the power supply voltage $V_{cc}$ and the bit line BL1, and the gate electrode is connected to the supply line of the inhibit signal IHB1. The NMOS transistor NT220 is connected between the supply line of the power supply voltage $V_{cc}$ and the bit line BL2, and the gate electrode is connected to the supply line of the inhibit signal IHB2.

The depletion type NMOS transistor NT440 is connected between the source of the NMOS transistor NT210 and the connection point of the memory string A0 and the bit line BL1, and the depletion type NMOS transistor NT450 is connected between the source of the NMOS transistor NT220 and the connection point of the memory string A1 and the bit line BL2. The gates of the NMOS transistors NT440 and NT450 are connected to the decouple signal supply line DCPL.

The NMOS transistor NT230 is connected between the connection point of the NMOS transistors NT440 and NT210 and the node SA21, and the NMOS transistor NT240 is connected between the connection point of the NMOS transistors NT450 and NT220 and the node SA21. The signal Ai is supplied to the gate electrode of the NMOS transistor NT230, and the signal /Ai (/ indicates inversion) is supplied to the gate electrode of the NMOS transistor NT240.

The NMOS transistor NT260 is connected between the node SA21 and the ground line GND, and the PMOS transistor PT210 is connected between the node SA21 and the supply line of the power supply voltage $V_{cc}$. Further, the connection point of the drain of the PMOS transistor PT210 and the node SA21 is connected to the gate electrodes of the NMOS transistors NT300 and NT350.

The signal DIS1 is supplied to the gate electrode of the NMOS transistor NT260, and the signal Vref is supplied to the gate electrode of the PMOS transistor PT210.

Further, the NMOS transistors NT250 and NT270 are connected in series between the node SA21 and the first storage node N21a of the latch circuit Q21, and the PMOS transistor PT220 is connected between the connection point of the NMOS transistor NT250 and the NMOS transistor NT270 and the supply line of the voltage VB (0<VB<$V_{cc}$-Vth).

The gate electrode of the NMOS transistor NT270 and the gate electrode of the PMOS transistor PT220 are connected to the first storage node N22a of the latch circuit Q22 and, operationally connected to the ground line GND via the NMOS transistor NT280.

The signal PGM is supplied to the gate electrode of the NMOS transistor NT250, and the signal DIS2 is supplied to the gate electrode of the NMOS transistor NT280.

The NMOS transistor NT400 is connected between the first storage node N21a of the latch circuit Q21 and the bus line IOi, and the NMOS transistor NT410 is connected between the first storage node N22a of the latch circuit Q22 and the bus line IOi+1.

The first storage node N21a of the latch circuit Q21 and the gate electrode of the NMOS transistor NT360 are operationally connected to the ground line via the NMOS transistor NT290. Further, the second storage node N21b of the latch circuit Q21 is connected to the gate electrode of the NMOS transistor NT380, and the signal DIS3 is supplied to the gate electrode of the NMOS transistor NT290.

Further, the NMOS transistors NT300, NT310, and NT320 are connected in series between the second storage node N21b of the latch circuit Q21 and the ground line GND, and the NMOS transistors NT330 and NT340 are connected in series between the connection point of the NMOS transistors NT300 and NT310 and the ground line.

The first storage node N22a of the latch circuit Q22 is connected to the gate electrode of the NMOS transistor NT310, and the second storage node N22b is connected to the gate electrode of the NMOS transistor NT330.

The signal ØLAT3 is supplied to the gate electrode of the NMOS transistor NT320, and the signal ØLAT2 is supplied to the gate electrode of the NMOS transistor NT340.

The NMOS transistors NT350, NT360, and NT370 are connected in series between the second storage node N22b of the latch circuit Q22 and the ground line GND, and the NMOS transistors NT380 and NT390 are connected in series between the connection point of the NMOS transistors NT350 and NT360 and the ground line.

The signal ØLAT1 is supplied to the gate electrode of the NMOS transistor NT370, and the signal ØLAT0 is supplied to the gate electrode of the NMOS transistor NT390.

Further, the gate of the NMOS transistor NT400 serving as the column gate is connected to the supply line of the signal Yi, and the gate of the NMOS transistor NT410 serving as the column gate is connected to the supply line of the signal Yi+1.

Further, the input terminal of the inverter INV21 is grounded, and the output terminal is connected to the judgement circuit 20. Further, the NMOS transistors NT420 and NT430 are connected in parallel between the output terminal of the inverter INV21 and the ground line. The gate electrode of the NMOS transistor NT420 is connected to the second storage node N21b of the first latch circuit Q21, and the gate electrode of the NMOS transistor NT430 is connected to the second storage node N22b of the second latch circuit Q22.

The judgement circuit 20 judges whether or not the write operation is ended with respect to all memory cell transistors by the potential of the output line of the inverter INV21.

Concretely, when the write operation is completed, the first storage nodes N21a and N22a of the latch circuits Q21 and Q22 become the power supply voltage $V_{cc}$ level, and the second storage nodes N21b and N22b become the ground level. As a result, the NMOS transistors NT420 and NT430 are held in the non-conductive state, and the potential of the output line of the inverter INV21 becomes the power supply voltage $V_{cc}$ level. By this, it is judged that the write operation is ended.

On the other hand, where there is a cell which is not sufficiently written, either or all of the first storage nodes N21a and N22a of the latch circuits Q21 and Q22 become the ground level, and the second storage nodes N21b and N22b become the power supply voltage $V_{cc}$ level. As a result, the NMOS transistor NT420 or NT430 or both transistors are held in a conductive state, and the potential of the output line of the inverter INV21 becomes the ground level. By this, it is judged that there is a cell which is not sufficiently written.

Next, an explanation will be made of the write, verify read, and read operations by the above structure in order with reference to the drawings.

First, an explanation will be made of the write operation.

Note that the write operation is performed by the present apparatus by rearranging externally input data by a not illustrated input buffer, storing the same in the latch circuits Q21 and Q22, then performing the write operation by the stored data.

Figures 13, 14:
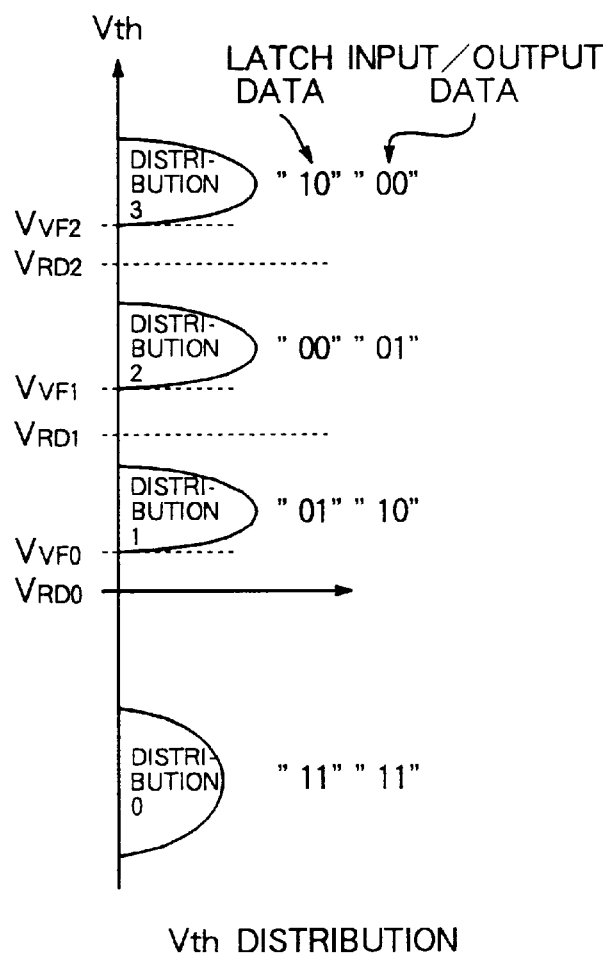
FIG. 13 is a view of the relationship between an externally input data and the data stored in a latch circuit in the third embodiment of FIG. 12.
FIG. 14 is a view of a correspondence between a threshold voltage Vth distribution and the write data in the third embodiment of FIG. 12.

FIG. 13 shows the relationship between the externally input data and the data stored in the latch circuit. Further, in the present example, it is assumed that the correspondence shown in FIG. 14 exists between the threshold voltage Vth distribution and the write data.

As shown in the figure, in the present embodiment, when the latch data of the latch circuit Q21 is "0" and the latch data of the latch circuit Q22 is "1", a write operation of the data "00" is carried out, while when the latch data of the latch circuit Q22 is "0", a write operation of the data "10" or "01" is carried out.

Further, when the write data is "00", the write operation is carried out at the bit line voltage and the channel voltage 0 V, while when the write data is "10" or "01", the write operation is carried out after setting the bit line voltage and the channel voltage at a certain voltage "VB" (for example 1 V).

Further, when the write data is "11", the bit line voltage becomes Vcc-Vth, the channel voltage becomes the inhibit voltage by the self boost, and the write operation is prevented.

Below, the write operation will be concretely explained by referring to FIG. 13, FIG. 14, and the timing charts of FIGS. 15A to 15M.

Figure 15:
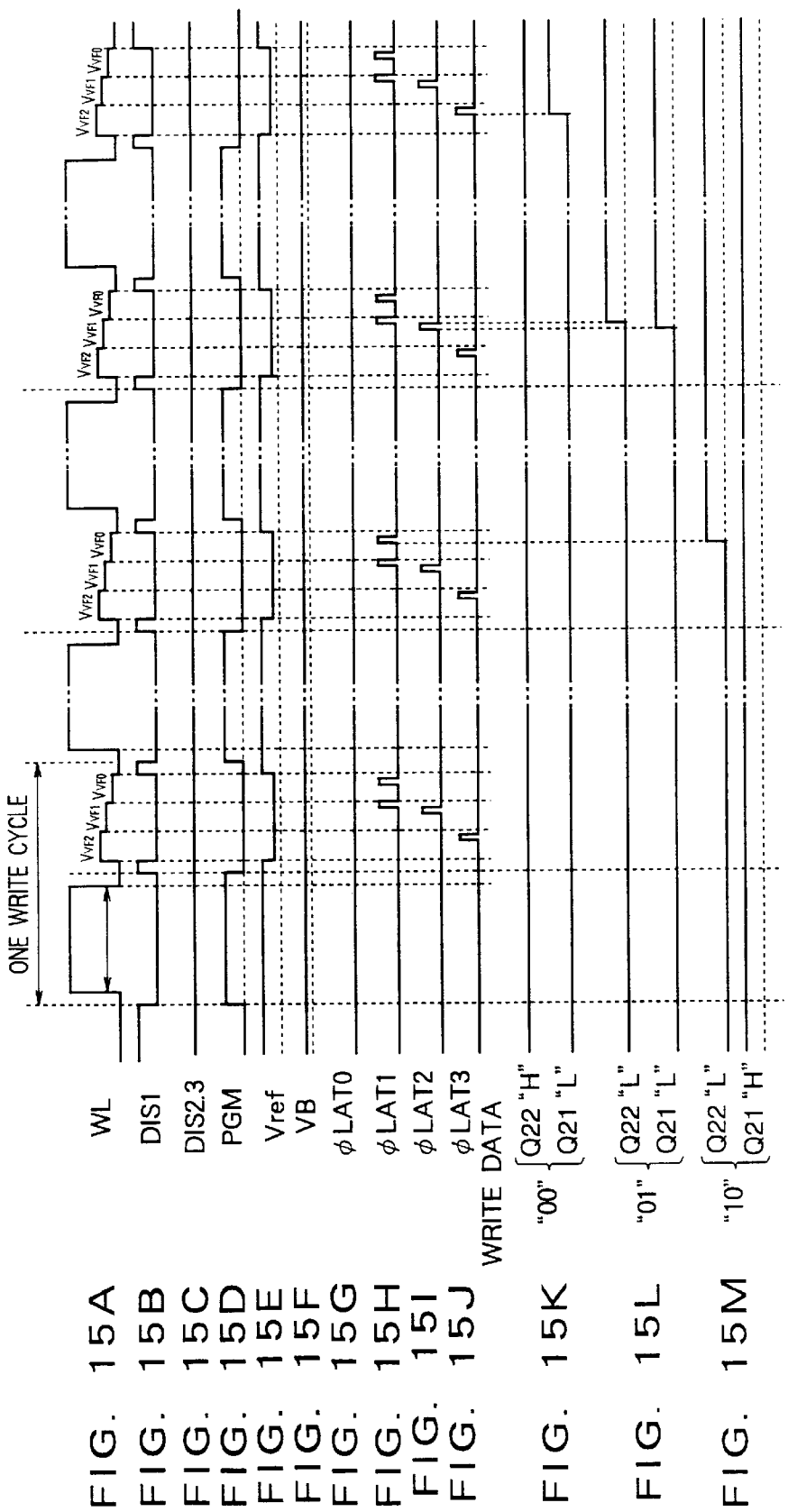
FIGS. 15A to 15M are timing charts for explaining the write operation of the circuit of FIG. 12.
Figure 16:
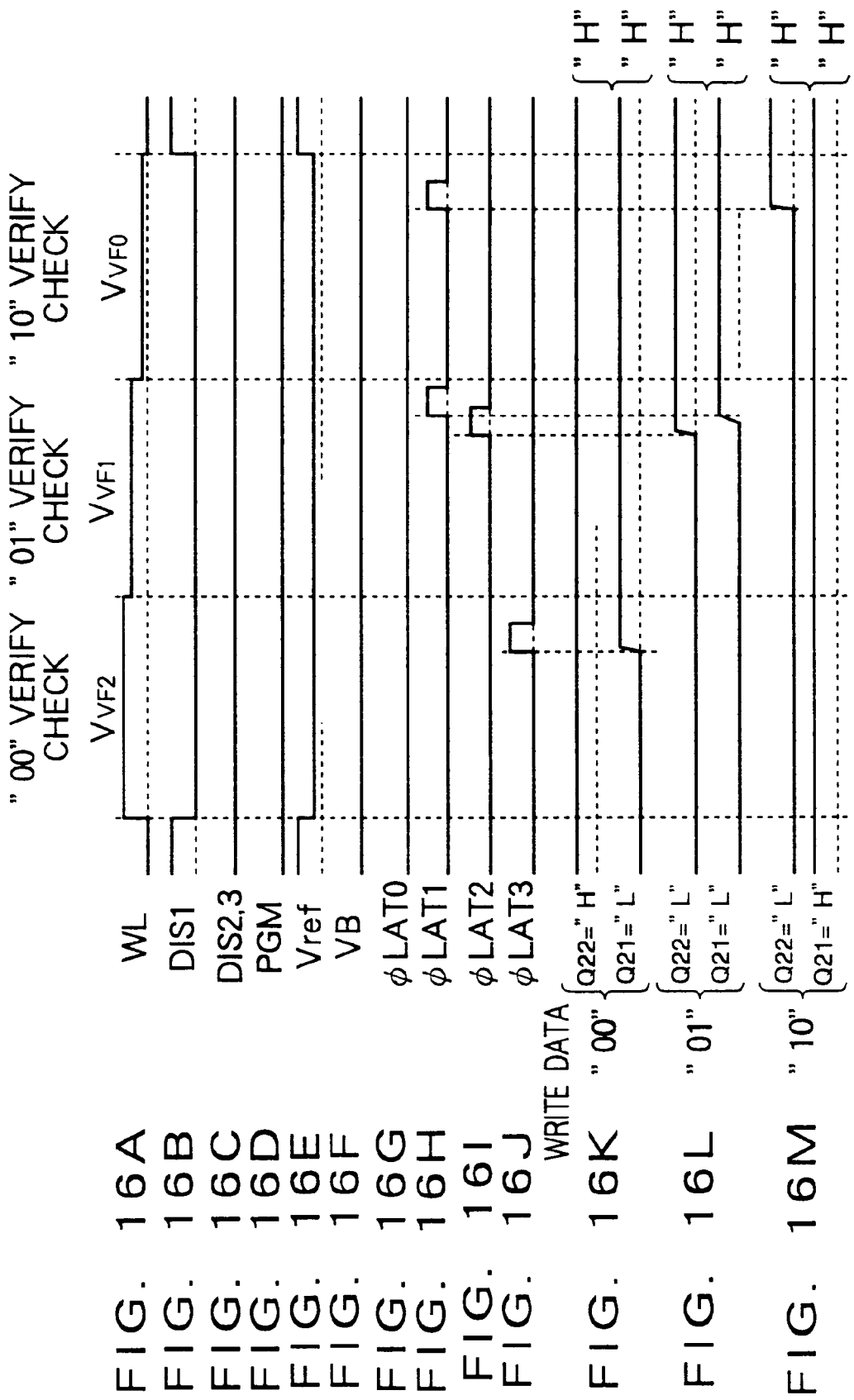
FIGS. 16A to 16M are timing charts for explaining the verify read operation of the circuit of FIG. 12.
Figure 17:
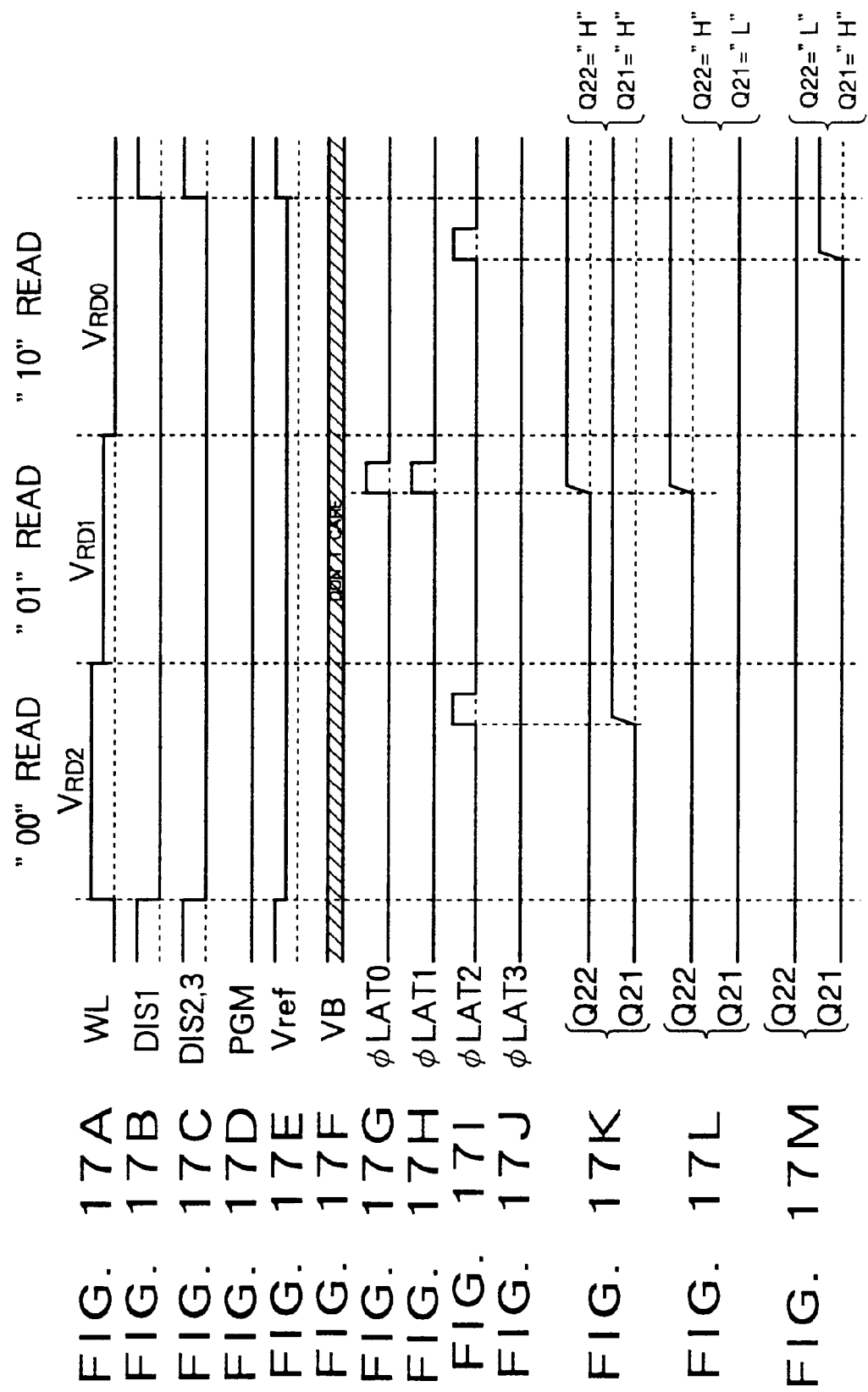
FIGS. 17A to 17M are timing charts for explaining the read operation of the circuit of FIG. 12.

At the write operation, first, as shown in FIG. 15D, the signal PGM is set at a high level. By this, the NMOS transistor NT250 is held in the conductive state.

Here, when the write data is "00" and "11", the latch data of the latch circuits Q21 and Q22 becomes {Q22, Q21}={H, L}, {H, H}, respectively as shown in FIG. 13.

Since the latch data of the latch circuit Q22 is at a high level, the PMOS transistor PT220 is held in the non-conductive state, and the NMOS transistor NT270 is held in the conductive state.

Due to the fact that the NMOS transistor NT270 becomes the conductive state, at the output of the latch circuit Q21 (output of the first storage node N21a), the bit line is charged through the NMOS transistors NT270 and NT250.

At this time, the output of the latch circuit Q21 is at a low level (0 V) when the write data is "00", so the bit line is charged to "0 V".

When the write data is "11", the output of the latch circuit Q21 is at a high level, therefore the bit line is charged to the voltage with a level reduced by exactly the amount of the threshold voltage Vth of the NMOS transistors NT270 and NT250 (Vcc-Vth).

On the other hand, when the write data are "01" and "10", the latch data of the latch circuits Q21 and Q22 becomes {Q22, Q21}={L, L}, {L, H}, respectively.

In this case, the latch data of the latch circuit Q22 is at a low level, therefore, the PMOS transistor PT220 is held in the conductive state, and the NMOS transistor NT270 is held in the non-conductive state.

Due to the fact that the PMOS transistor PT220 becomes the conductive state, as shown in FIG. 15F, the bit line is charged to the output "VB" of a certain power supply circuit set at a value within a range of 0<VB<$V_{cc}$-Vth, for example, 1 V.

Then, as shown in FIG. 15A, when defining the word line voltage WL as VWL, when the write data is "00", the voltage between the word line WL and the channel is "VWL", and in contrast, the voltage between the word line WL and the channel of cells having the write data of "01" and "10" becomes "VWL-VB".

When considering the write time, the further the threshold voltage Vth of writing from a UV irradiation level (UV level), the exponentially longer the write time.

In the ISPP writing, by raising the word line voltage at the write operation by ΔVWL at a time at every write step, the relationship of the shift of the threshold voltage Vth and the write time is made linear.

However, if the write operation is started at the same word line voltage and the same channel voltage, the write operation of the level furthest from the UV level defines the entire write time.

In the present embodiment, the electric field applied on the tunnel oxide film at the writing of the cell with the write data ("00") furthest from the UV irradiation state is set higher than the other write data "01" and "10", therefore the write time of the write data "00" becomes shorter and as a result the entire write time becomes shorter.

As described above, where the write data is "00", the bit line voltage becomes 0 V, and the channel voltage becomes 0 V;

where the write data is "01", the bit line voltage becomes "VB", and the channel voltage becomes "VB";

where the write data is "10", the bit line voltage becomes "VB", and the channel voltage becomes "VB"; and where the write data is "11", the bit line voltage becomes (Vcc-Vth), and the channel voltage becomes the inhibit voltage, all data are simultaneously written, and then the write operation of the cell where the write data is "00" is raised in speed.

Next, an explanation will be made of the verify read operation by referring to FIG. 14 and the timing charts of FIGS. 16A to 16M.

In the verify operation, a write check operation of "00", "01", and "10" is carried out whenever one write operation is ended.

In the verify operation, similar to the usual read operation, the signal Vref is set at a certain voltage, a charging current (Iref) of a constant value is supplied to the bit line by the PMOS transistor PT210, and simultaneously with this, the word line is raised.

At this time, if the threshold voltage Vth of the memory cell is higher than the word line voltage, the cell current does not flow, therefore the bit line voltage is charged by Iref·t/CBL and rises.

On the other hand, if the threshold voltage Vth of the memory cell is lower than the word line voltage, the charging current Iref flows in the cell as it is, and the bit line voltage does not rise to or over a voltage VDS between the drain and the source (about 0.4 V) when the charging current Iref flows in the memory cell.

Then, after the elapse of a predetermined time, judgement is carried out according to whether the level of the node SA21 is high or low.

Specifically, first the word line voltage is set at VVF2 (refer to FIG. 14), and the read operation is carried out.

At this time, when the threshold voltage Vth of the memory cell is higher than the word line voltage VVF2, the cell current does not flow. By this, the node SA21 boosts up to the voltage near the power supply voltage $V_{cc}$.

On the other hand, when the threshold voltage Vth of the memory cell is lower than the word line voltage VVF2, it becomes the low voltage of about the voltage VDS between the drain and the source of the memory cell.

Here, when the signal ØLAT3 is set at a high level, the NMOS transistor NT320 is held in the conductive state.

At this time, when the latch data of the latch circuit Q22 is at a high level, that is, the write data is "00", and the threshold voltage Vth of the memory cell is higher than VVF2, the NMOS transistors NT300 and NT310 storage node N21b of the latch circuit Q21 is pulled to the ground level. As a result, the latch data of the latch circuit Q21 (level of the first storage node N21a) switches from a low level to high level.

Namely, the latch data of the latch circuits Q22 and Q21 becomes {Q22, Q21}={H, H}.

By this, at the rewriting, the latch data of the latch circuit Q22 is at a high level (the level of the first storage node N22a is at high level), therefore the PMOS transistor PT220 is held in the non-conductive state, and the NMOS transistor NT270 is held in the conductive state.

Then, as mentioned above, the latch data of the latch circuit Q21 (level of the first storage node N21a) has switched from a low level to high level, therefore the bit line is charged to the voltage ($V_{cc}$-Vth), the channel becomes the inhibit voltage by the self boost, and the write operation is prevented.

On the other hand, when the threshold voltage Vth of the memory cell is lower than the word line voltage VVF2, the NMOS transistor NT300 is held in the non-conductive state, therefore the latch data of the latch circuit Q21 does not change, and a write operation is carried out at the rewriting.

Next, the word line voltage is set at VVF1 (refer to FIG. 14) and the read operation is carried out.

At this time, when the threshold voltage Vth of the memory cell is higher than the word line voltage VVF1, the cell current does not flow. By this, the level of the node SA21 boosts up to the voltage near the power supply voltage $V_{cc}$.

On the other hand, when the threshold voltage Vth of the memory cell is lower than the word line voltage VVF1, it becomes a low voltage of about VDS between the drain and the source of the memory cell (about 0.4 V).

Here, when the signal ØLAT2 is set at a high level, the NMOS transistor NT340 is held in the conductive state.

At this time, when the latch data of the latch circuit Q22 is at a low level, that is, the first storage node N22a is at a low level and the second storage node N22b is at a high level, and the threshold voltage Vth of the memory cell is higher than VVF1, the NMOS transistors NT300 and NT330 are held in the conductive state, therefore the second storage node N21b of the latch circuit Q21 is pulled to the ground level. As a result, the latch data of the latch circuit Q21 (level of the first storage node N21a) switches from a low level to high level (where the write data is "01").

Namely, the latch data of the latch circuits Q22 and Q21, i.e. {Q22, Q21} changes from {L, L} to {L, H}.

Then, immediately after this, when the signal ØLAT1 is set at a high level this time, since the level of the first storage node N21a of the latch circuit Q21 has been inverted from a low level to high level, the NMOS transistor NT360 is held in the conductive state. At this time, since the NMOS transistors NT350 and NT370 are also held in the conductive state, the second storage node N22b of the latch circuit Q22 is pulled to the ground level. As a result, the latch data of the latch circuit Q22 (level of the first storage node N22a) switches from a low level to high level.

At this time, the latch data {Q22, Q21} of the latch circuits Q22 and Q21 changes from {L, H} to {H, H}.

Since the latch data {Q22, Q21} of the latch circuits Q22 and Q21 become {H, H}, the write operation is prevented at the rewriting.

On the other hand, when the threshold voltage Vth of the memory cell is lower than the word line voltage VVF1, the potential of the node SA21 is low, therefore even if the signal ØLAT2 is set at a high level and the signal ØLAT1 is set at a high level, the NMOS transistors NT300 and NT350 having gate electrodes which are connected to the node SA21 are held in the non-conductive state, therefore there is no change in the latch data.

Here, where the threshold voltage Vth of the memory cell is higher than the word line voltage VVF1, the latch data of the latch circuits Q22 and Q21 after the signal ØLAT2 is set at a high level and the read operation is carried out becomes {Q22, Q21}={L, H}. This is the same as the latch data where the write data is "10".

At the stage of setting the signal ØLAT1 at a high level and sensing, according to whether the original latch data is {Q22, Q21}={L, H} (=if the write data is "10") or the original write data is "01", the immediately prior signal ØLAT2 is set at a high level, the verify read operation is carried out, and the judgement if the latch data {Q22, Q21} has changed from {L, L} to {L, H} cannot be carried out.

However, if the threshold voltage Vth has become the word line voltage VVF1 or more by the verify operation of the present embodiment, it should have become at least the word line voltage VVF0 or more at the verify operation of the previous time, therefore, it is judged that the writing is sufficient at the verify operation by setting the previous word line voltage at VVF0 (explained below), and the latch data {Q22, Q21} should be inverted to {H, H}.

Accordingly, in this case, if the latch data {Q22, Q21} of the latch circuits Q22 and Q21 is equal to {L, H}, this may be thought to be the inverted data of the latch data of the latch circuit Q21 resulting from a verify operation in the case of original write data of "01" and setting the signal ØLAT2 at a high level.

Finally, the word line voltage is set at VVF0 (refer to FIG. 14), and the read operation is carried out.

At this time, when the threshold voltage Vth of the memory cell is higher than the word line voltage VVF0, the cell current does not flow. Due to this, the node SA21 rises to a voltage near the power supply voltage $V_{cc}$.

On the other hand, when the threshold voltage Vth of the memory cell is lower than the word line voltage VVF0, it becomes the low voltage of about the voltage VDS between the drain and the source of the memory cell.

Here, if the signal ØLAT1 is set at a high level, the NMOS transistor NT370 is held in the conductive state.

At this time, when the latch data of the latch circuit Q21 is at a high level, that is, the write data is "10", and the threshold voltage Vth of the memory cell is higher than VVF0, the NMOS transistors NT350 and NT370 are held in the conductive state, therefore the second storage node N22b of the latch circuit Q22 is pulled to the ground level. As a result, the latch data of the latch circuit Q22 (level of the first storage node N22a) switches from a low level to high level.

Namely, the latch data of the latch circuits Q22 and Q21 becomes {Q22, Q21}={H, H}.

By this, a write operation is prevented at the time of rewriting.

When the write data is "01", that is, the latch data of the latch circuits Q22 and Q21 is {Q22, Q21}={L, L}, the first storage node N21a of the latch circuit Q21 is at low level, therefore even if the signal ØLAT1 is set at a high level, and the NMOS transistor NT370 is held in the conductive state, the NMOS transistor NT360 is held in the non-conductive state, and thus the latch data of the latch circuit Q22 does not change (not inverted).

On the other hand, when the threshold voltage Vth of the memory cell is lower than the word line voltage VVF0, the NMOS transistor NT350 is held in the non-conductive state, therefore, the latch data of the latch circuit Q22 does not change, and a write operation is performed at the time of rewriting.

As described above, the latch data of the memory cells judged to be written "OK" at the verify read operation are all transformed to {Q22, Q21}={H, H}.

After the end of the verify read operation, if all cells have been sufficiently written, the second storage nodes N21b and N22b of the latch circuits Q22 and Q21 become the ground level. As a result, the NMOS transistors NT420 and NT430 are held in the non-conductive state, and the potential of the output line of the inverter INV21 becomes the power supply voltage V$_{cc}$ level. By this, it is judged that the write operation has ended.

On the other hand, when there is a cell which is not sufficiently written, either or all of first storage nodes N21a and N22a of the latch circuits Q21 and Q22 become the ground level, and the second storage nodes N21b and 22b become the power supply voltage V$_{cc}$ level. As a result, the NMOS transistor NT420 or NT430 or both transistors are held in the conductive state, and the potential of the output line of the inverter INV21 becomes the ground level. By this, it is judged that there is a cell which is not sufficiently written.

Next, an explanation will be made of the read operation by referring to FIG. 14 and the timing charts of FIGS. 17A to 17M.

At the time of stand-by, signals DIS1, DIS2, and DIS3 are set at the power supply voltage V$_{cc}$ level, the bit line is set at the ground level, and the latch data of the latch circuits Q22 and Q21 are reset to a low level.

First, the read operation of "00" is carried out.

At this time, the signal Vref is set at a "certain voltage" and supplied to the gate electrode of the PMOS transistor PT210, the reference current Iref flows, and the word line voltage is set at VRD2.

At this time, if the threshold voltage Vth of the memory cell is the word line voltage VRD2 or more (distribution 3), the cell current does not flow, so the bit line voltage becomes high, while if it is VRD2 or less (distributions 2 to 0), the voltage of about voltage VDS between the drain and the source (about 0.4 V) is held.

Here, when the signal ØLAT2 is set at a high level, the NMOS transistor NT340 is held in the conductive state, and the latch data of the latch circuit Q22 is at low level, therefore the second storage node N22b thereof is at a high level.

Accordingly, the NMOS transistor NT330 is also held in the conductive state. If the threshold voltage of the memory cell is at the distribution 3, the NMOS transistor NT300 is also held in the conductive state.

As a result, the second storage node N21b of the latch circuit Q21 is pulled to the ground level. As a result, the latch data of the latch circuit Q21 (level of the first storage node N21a) switches from a low level to high level.

Further, when the threshold voltage of the memory cell is at the distributions 2 to 0, the node SA 21 is a low voltage, therefore the NMOS transistor NT300 is held in the non-conductive state.

Accordingly, the latch data of the latch circuit Q21 (level of the first storage node N21a) holds its low level.

Namely, the latch data after the read operation at the word line voltage VRD2 become as follows:

Distribution 3: {Q22, Q21}={L, H}

Distribution 2 to 0: {Q22, Q21}={L, L}

Next, the word line voltage is set at VRD1, and the read operation is carried out.

At this time, the cell current does not flow in the memory cell in which the threshold voltage is at the distribution 3 or 2, therefore the node SA21 becomes the voltage near the power supply voltage V$_{cc}$, while the cell current flows in the cell in which the threshold voltage is at the distribution 1 or 0, therefore the node SA21 becomes the low voltage of about the voltage VDS between the drain and the source of the memory cell.

Here, the signals ØLAT0 and signal ØLAT1 are set at a high level, and the NMOS transistors NT390 and NT370 are held in the conductive state.

At this time, in the memory cells in which the threshold voltage is at the distribution 1 or 0, both of the NMOS transistors NT300 and NT350 are held in the non-conductive state, therefore the latch data of the latch circuits Q21 and Q22 does not change.

On the other hand, in the memory cell in which the threshold voltage is in distribution 3, the latch data of the latch circuit Q21 (level of the first storage node N21a) is at high level, therefore the NMOS transistors NT350, NT360, and NT370 are held in the conductive state As a result, the second storage node N22b of the latch circuit Q22 is pulled to the ground level, and the latch data of the latch circuit Q22 (level of the first storage node N22a) switches from a low level to high level.

In the memory cells in which the threshold voltage is at the distribution 2 as well, the second storage node N21b of the latch circuit Q21 is at a high level, therefore the NMOS transistors NT350, NT380, and NT390 are held in the conductive state.

As a result, the second storage node N22b of the latch circuit Q22 is pulled to the ground level, and the latch data of the latch circuit Q22 (level of the first storage node N22a) switches from a low level to high level.

Namely, the latch data after the read operation at the word line voltage VRD1 becomes as follows:

Distribution 3: {Q22, Q21}={H, H}

Distribution 2: {Q22, Q21}={H, L}

Distribution 1 or 0: {Q22, Q21}={L, L}

Finally, the word line voltage is set at VRD0 and the read operation is carried out.

At this time, the cell current does not flow in the cells in which the threshold voltage is at the distributions 3 to 1, therefore the node SA21 becomes the voltage near the power supply voltage $V_{cc}$, while the cell current does not flow in the memory cell in which the threshold voltage is at the distribution 0, therefore it becomes the voltage of about the voltage VDS between the drain and the source of the memory cell.

Here, the signal ØLAT2 is set at a high level, and the NMOS transistor NT340 is held in the conductive state.

At this time, in the memory cells in which the threshold voltage is at the distributions 3 to 1, both of the NMOS transistors NT300 and NT350 are held in the conductive state, but between them, in the second storage node N22b of the latch circuit Q22, only the distribution 1 has a high level, so the NMOS transistor NT330 is held in the conductive state only in the case of the distribution 1.

As a result, only in the case of the distribution 1, the second storage node N21b of the latch circuit Q21 is pulled to the ground level, and the latch data of the latch circuit Q21 (level of the first storage node N21a) switches from a low level to high level.

Concerning the distribution 0, the potential of the node SA21 is about the voltage VDS between the drain and the source, therefore the NMOS transistor NT300 is held in the non-conductive state, and the latch data of the latch circuit Q21 does not change.

Namely, the latch data after the read operation at the word line voltage VRD0 become as follows:

Distribution 3: {Q22, Q21}={H, H}
Distribution 2: {Q22, Q21}={H, L}
Distribution 1: {Q22, Q21}={L, H}
Distribution 0: {Q22, Q21}={L, L}

These inverted signals are output to the outside through a not illustrated IO buffer.

As explained above, according to the third embodiment, the write operation of the data "10" and "01" and the write operation of the data "00" are advanced in parallel. Also, the electric field applied on the tunnel oxide film of the cell into which the data "00" is to be written is made high. Therefore, there is an advantage that the write time can be shortened.

Figure 2:
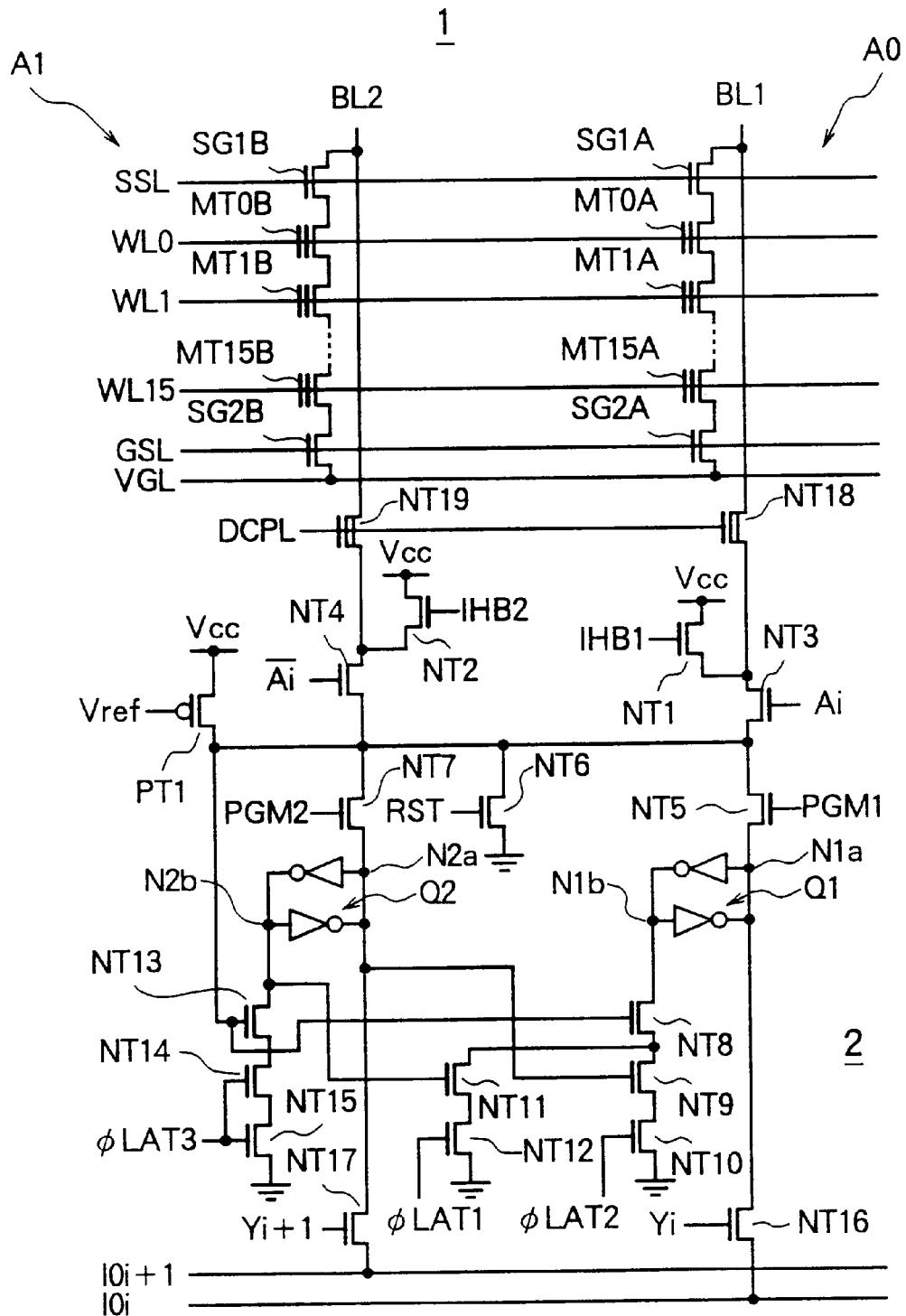
FIG. 2 is a circuit diagram of the configuration of principal parts of a NAND type flash memory of the related art.
Figure 3A:
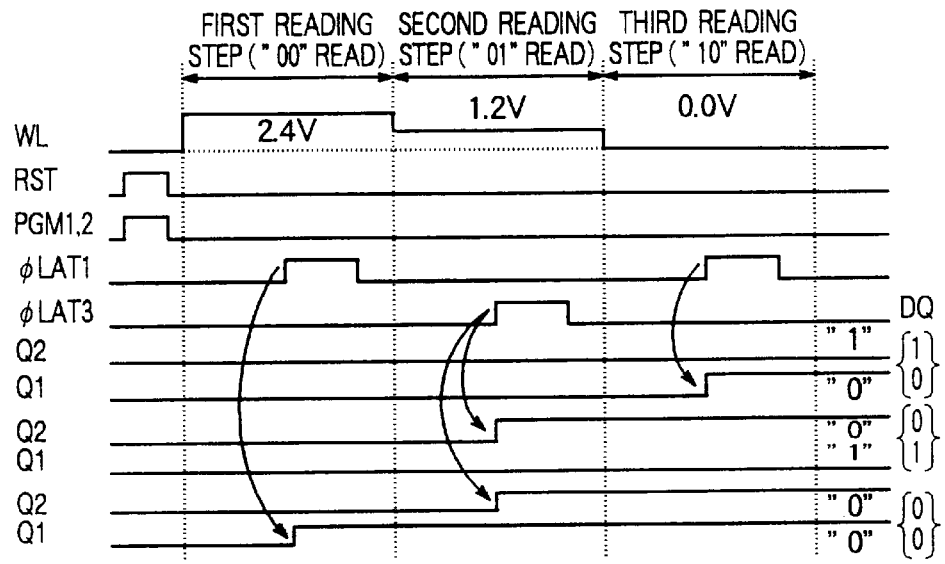
FIGS. 3A and 3B are timing charts for explaining an operation of the circuit of FIG. 2.
Figure 3B:
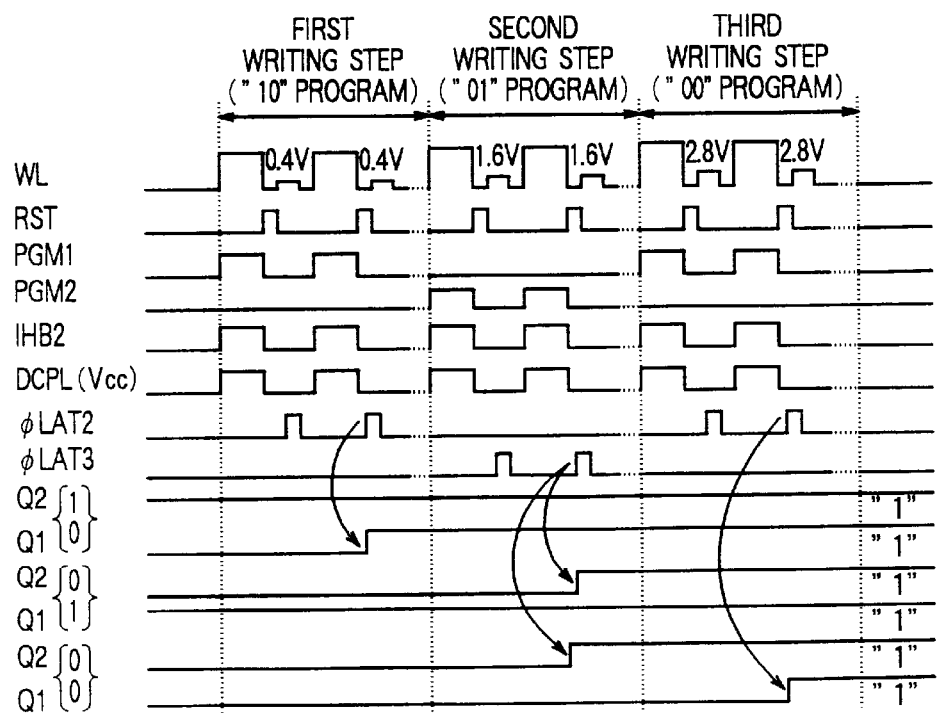
Figure 4:
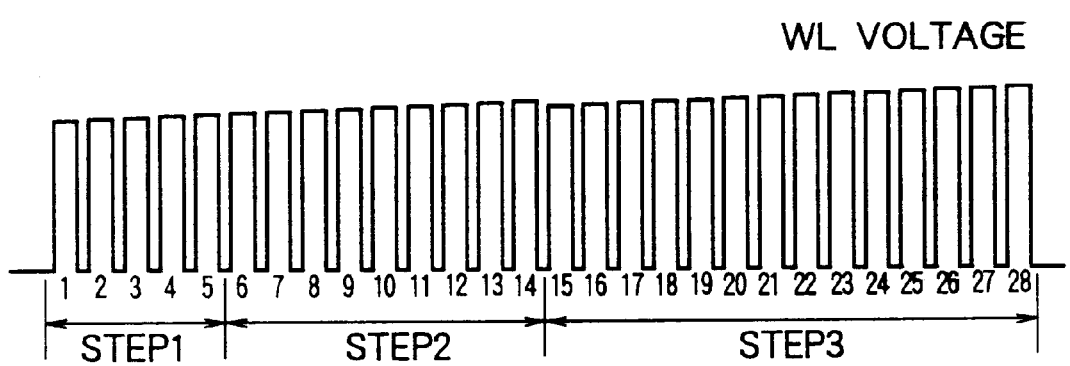
FIG. 4 is a view for explaining the problem of the related art.

The size of the circuit is increased by only a few transistors in comparison with the circuit of the related art shown in FIG. 2, and the write time is halved.

Fourth Embodiment

Figure 18:
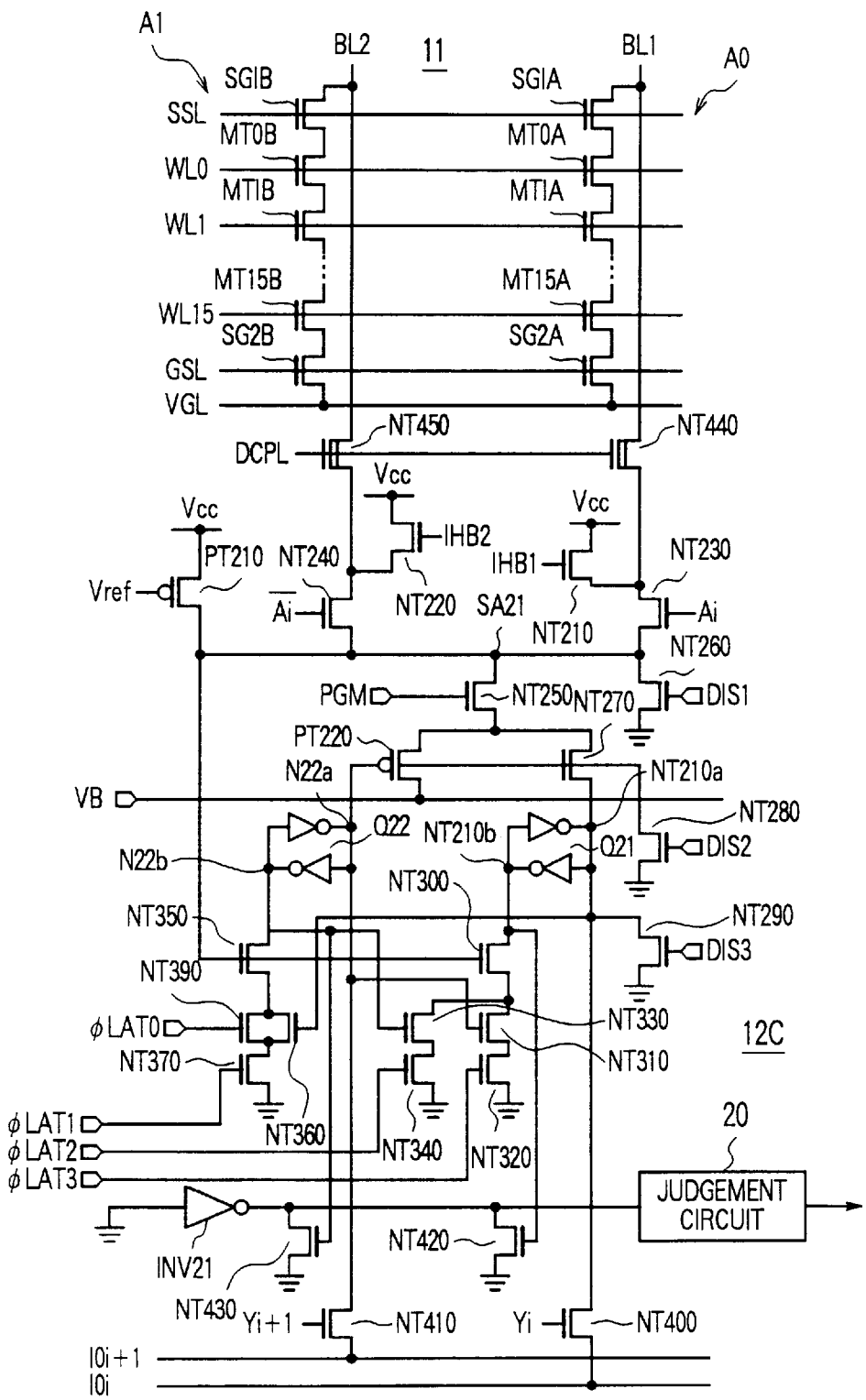
FIG. 18 is a circuit diagram of a fourth embodiment of a nonvolatile semiconductor memory device according to the present invention.

FIG. 18 is a circuit diagram of a fourth embodiment of a nonvolatile semiconductor memory device according to the present invention.

In the fourth embodiment, the NMOS transistor NT380 of the circuit shown in FIG. 12 is removed, and the drain and the source of the NMOS transistor NT390 are connected to the drain and source of the NMOS transistor NT360.

The rest of the structure is similar to that of the circuit of FIG. 12. The operation is also similar.

According to the fourth embodiment, in addition to the effect of the third embodiment, there is an advantage that the circuit can be further simplified.

While the invention has been described by reference to specific embodiments chosen for purposes of illustration, it should be apparent that numerous modifications could be made thereto by those skilled in the art without departing from the basic concept and scope of the invention.

What is claimed is:

1. A nonvolatile semiconductor memory device having a plurality of memory cells in each of which an amount of charge stored in a charge storage unit changes according to a voltage supplied to a word line and a bit line, a threshold voltage changes according to the change of the amount of charge stored, and data of a value according to the threshold voltage is stored are connected, memory strings having one end and the other end connected to the bit line and a ground line via selection transistors controlled in conductive state in accordance with a gate voltage are arranged in the form of a matrix, control gates of memory cells of the same row are connected to a common word line, and multi-bit data is written into the memory cells in units of pages by using self boost, comprising:

a precharging means for precharging all bit lines to a predetermined voltage before the write operation, and a write control circuit having a latch circuit by which the write data is latched, making a bit line selected in accordance with an address discharge in accordance with the latch data, and performing the write operations in parallel, wherein said write operations are accomplished by Fowler-Nordheim tunneling using self boost operation.

2. A nonvolatile semiconductor memory device as set forth in claim 1, further comprising:

a verify read circuit for judging whether or not every write bit is sufficiently written at the time of a write operation by sequentially raising the word line voltage from a low level to high level.

3. A nonvolatile semiconductor memory device as set forth in claim 1, wherein the write control circuit comprises one bit's worth of a latch circuit corresponding to every bit line.

4. A nonvolatile semiconductor memory device as set forth in claim 3, wherein the latch circuit includes a first storage node for holding a latch data level and a second storage node for holding an inverted level thereof and a switching means for connecting the selected bit line and a reference potential when the level of the second storage node of the latch circuit is a predetermined level.

5. A method of data programming of a nonvolatile semiconductor memory device having a memory cell in which an amount of charge stored in a charge storage unit changes according to a voltage supplied to a word line and a bit line, a threshold voltage changes according to the change of the amount of charge stored, and data of a value according to the threshold voltage is stored and writing multi-bit data into memory cells in units of pages, comprising the steps of:

precharging all bit lines to a predetermined voltage before the write operation;

making a bit line selected in accordance with an address discharge in accordance with latch data at the time of writing; and performing write operations in parallel, wherein said write operations are accomplished by Fowler-Nordheim tunneling using self boost operation.

6. A nonvolatile semiconductor memory device comprising:

a memory cell in which an amount of charge stored in the charge storage unit changes via a tunnel insulation film according to a voltage supplied to a word line and a bit line, a threshold voltage changes according to the change of the amount of charge stored and data of a value according to the threshold voltage is stored and writing multi-bit data into memory cells in units of pages; and means for performing the write operations by setting an electric field applied to the memory cell higher than the other write data in a case where the write data is the data for making the threshold voltage of the memory cell to be written in a value furthest from the threshold voltage in an initial erasing state, wherein said write operations also employ Fowler-Nordheim tunneling using self boost operation.

7. A nonvolatile semiconductor memory device as set forth in claim 6, further comprising:

a verify read circuit for judging whether or not every write bit is sufficiently written at the time of a write operation.

8. A nonvolatile semiconductor memory device as set forth in claim 7, further comprising:

an input buffer for rearranging externally input multi-bit data and transferring the same to the latch circuit of the write control circuit.

9. A nonvolatile semiconductor memory device comprising:

a memory cell in which an amount of charge stored in the charge storage unit changes according to a voltage supplied to a word line and a bit line, a threshold voltage changes according to the change of the amount of charge stored, and data of a value according to the threshold voltage is stored and writing multi-bit data into memory cells in units of pages; and a write control circuit having a latch circuit and performing the write operations by charging the corresponding bit line to a first voltage when the latch data is data for making the threshold voltage of the memory cell a value furthest from the threshold voltage in the initial erasing state and by charging the bit line to a second voltage higher than the first voltage when the latch data is data for making the threshold voltage of the memory cell another threshold voltage, wherein said write operations also employ Fowler-Nordheim tunneling using self boost operation.

10. A nonvolatile semiconductor memory device as set forth in claim 9, further comprising:

a verify read circuit for judging whether or not every write bit is sufficiently written at the time of a write operation.

11. A nonvolatile semiconductor memory device as set forth in claim 9, wherein the write control circuit comprises one bit's worth of a latch circuit corresponding to every bit line.

12. A nonvolatile semiconductor memory device as set forth in claim 11, wherein the first voltage is the ground voltage, and the second voltage is an intermediate voltage between the power supply voltage and the ground voltage.

13. A method of data programming of a nonvolatile semiconductor memory device having a memory cell in which an amount of charge stored in a charge storage unit changes via a tunnel insulation film according to a voltage supplied to a word line and a bit line, a threshold voltage changes according to the change of the amount of charge stored, and data of a value according to the threshold voltage is stored and writing multi-bit data into memory cells in units of pages, comprising the steps of:

setting an electric field applied on the memory cell higher than the other write data in a case where the write data is data for making the threshold voltage of the memory cell to be written in a value furthest from the threshold voltage in an initial erasing state; and performing a write operation, wherein said write operation is accomplished by Fowler-Nordheim tunneling using self boost operation.

14. A method of data programming of a nonvolatile semiconductor memory device having a memory cell in which an amount of charge stored in a charge storage unit changes according to a voltage supplied to a word line and a bit line, threshold voltage changes according to the change of the amount of charge stored and data of a value according to the threshold voltage is stored and writing multi-bit data into memory cells in units of pages, comprising the steps of:

charging the corresponding bit line to a first voltage when the write data is data for making the threshold voltage of the memory cell a value furthest from the threshold voltage in the initial erasing state;

charging the bit line to a second voltage higher than the first voltage when the write data is data for making the threshold voltage of the memory cell another threshold voltage; and performing a write operation, wherein said write operation is accomplished by Fowler-Nordheim tunneling using self boost operation.

15. A data write method of a nonvolatile semiconductor memory device as set forth in claim 14, wherein the first voltage is the ground voltage and the second voltage is an intermediate voltage between the power supply voltage and the ground voltage.

* * * * *